(12) United States Patent
Snow et al.

(10) Patent No.: US 9,182,435 B2
(45) Date of Patent: Nov. 10, 2015

(54) METHOD AND SOFTWARE FOR SPATIAL PATTERN ANALYSIS

(71) Applicants: Jeffrey M Snow, Bloomington, IN (US); Michael Schumm, Bloomington, IN (US); William L Shaff, Bedford, IN (US); Terry Carlson, Washington, IN (US); Carl Baker, Avoca, IN (US)

(72) Inventors: Jeffrey M Snow, Bloomington, IN (US); Michael Schumm, Bloomington, IN (US); William L Shaff, Bedford, IN (US); Terry Carlson, Washington, IN (US); Carl Baker, Avoca, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 385 days.

(21) Appl. No.: 13/630,806

(22) Filed: Sep. 28, 2012

(65) Prior Publication Data

US 2013/0093622 A1  Apr. 18, 2013

Related U.S. Application Data

(60) Division of application No. 12/347,659, filed on Dec. 31, 2008, now Pat. No. 8,421,673, which is a continuation-in-part of application No. 12/121,346, filed on May 15, 2008, now Pat. No. 8,077,098.

(51) Int. Cl.
*G01R 29/10* (2006.01)

(52) U.S. Cl.
CPC ...................................... *G01R 29/10* (2013.01)

(58) Field of Classification Search
USPC ................. 342/169, 195, 360, 372, 445, 451; 455/67.11, 423
See application file for complete search history.

(56) References Cited

U.S. PATENT DOCUMENTS

| | | |
|---|---|---|
| 5,021,792 A | 6/1991 | Hwang |
| 5,077,557 A | 12/1991 | Ingensand |
| 5,185,610 A | 2/1993 | Ward et al. |
| 5,193,064 A | 3/1993 | Maki |
| 5,225,842 A | 7/1993 | Brown et al. |
| 5,347,286 A | 9/1994 | Barbitch |
| 5,568,152 A | 10/1996 | Janky et al. |
| 5,986,603 A | 11/1999 | Schipper |
| 6,697,752 B1 | 2/2004 | Korver et al. |
| 6,785,553 B2 | 8/2004 | Chang et al. |
| 6,963,301 B2 | 11/2005 | Schantz et al. |
| 7,292,183 B2 | 11/2007 | Bird et al. |
| 7,339,522 B2 | 3/2008 | Dobson |
| 8,077,098 B2 | 12/2011 | Snow et al. |
| 2003/0122078 A1 | 7/2003 | Fritzel |
| 2005/0060093 A1 | 3/2005 | Ford et al. |
| 2005/0200523 A1 | 9/2005 | Durban |
| 2005/0203683 A1 | 9/2005 | Olsen et al. |
| 2006/0027404 A1 | 2/2006 | Foxlin |
| 2006/0033657 A1 | 2/2006 | Lawrence et al. |
| 2007/0198159 A1 | 8/2007 | Durkos et al. |

OTHER PUBLICATIONS

McLean, Grant, Virtual Anechoic Chamber using GPS Signals, Journal of navigation, Jan. 1, 2007, Abstract of pp. 33-43, vol. 60, Cambridge Univ Pres, UK.

Hardesty, Mark et. al, Evolution Leads to Revolution-Helicopter Flight Testing, Sep. 14, 1999, The Boeing Comapny, Mesa, Arizona.

*Primary Examiner* — Dao Phan

(74) *Attorney, Agent, or Firm* — Christopher A. Monsey

(57) ABSTRACT

A method and software implementation for spatial pattern analysis. A user-guided test procedure is implemented to measure features of an antenna under test to determine the antenna's far-field patterns. The antenna features include RF amplitude or phase, and position and orientation relative to a receiving object.

26 Claims, 30 Drawing Sheets

```
                    GPS MESSAGE STRUCTURE ~ 472
typedef struct _SEND_GPS_RESULTS_REC
{
    int MsgID;
    BYTE SRMessageType;
    BYTE PositionFormat;
    BYTE Status;    // OR IsDataValid OR m_AntennaLocation OR
                    // m_CurrentDynamics OR m_BatteryAVoltage OR
                    // m_DatumId m_PowerFlag
                    // OR m_ProjectionType
    BYTE Status2;   // m_AntennaMeasurementsType OR m_BatteryBVoltage
                    // OR m_HemisphereType
    BYTE Status3;   // OR Dynamics OR m_SensorSystemVoltage
    BYTE Status4;   //SolutionTypeFlag
    BYTE Status5;   //ExternalAidingFlag
    BYTE Status6;   // FailureFlag
    int Int1;       // NumberOfAmbiguities OR m_CutoffElevationDegrees OR
                    // m_NumberOfSatellites OR NumberOfSatellitesInUse OR
                    // m_ZoneNumber
    int Confidence;
    int Latency;
    double Easting;   // OR LAT
    double Northing   // OR LONG
    double Altitude;  // m_HeightMeters or m_AntennaHeightMeters or
                      // AntennaAltitudeMeters
    double QualityLatNorth;
    double QualityLonEast;
    double QualityAlt;
    char Time[31];  // TIME = 12 // OR m_AntennaName < 30 OR
                    // m_ProjectionName;
    char Date[11];  // DATE = 8 // OR m_AntennaSerialNumber < 11
} SEND_GPS_RESULTS_REC;

NFM MESSAGE STRUCTURE ~ 474
typedef struct _SEND_NFMSETAZELRL_REC
{
    int MsgID;
    int Type;
    long ID;
    double Azimuth;
    double Elevation;
    double Roll;
} SEND_NFMSETAZELRL_REC;
```

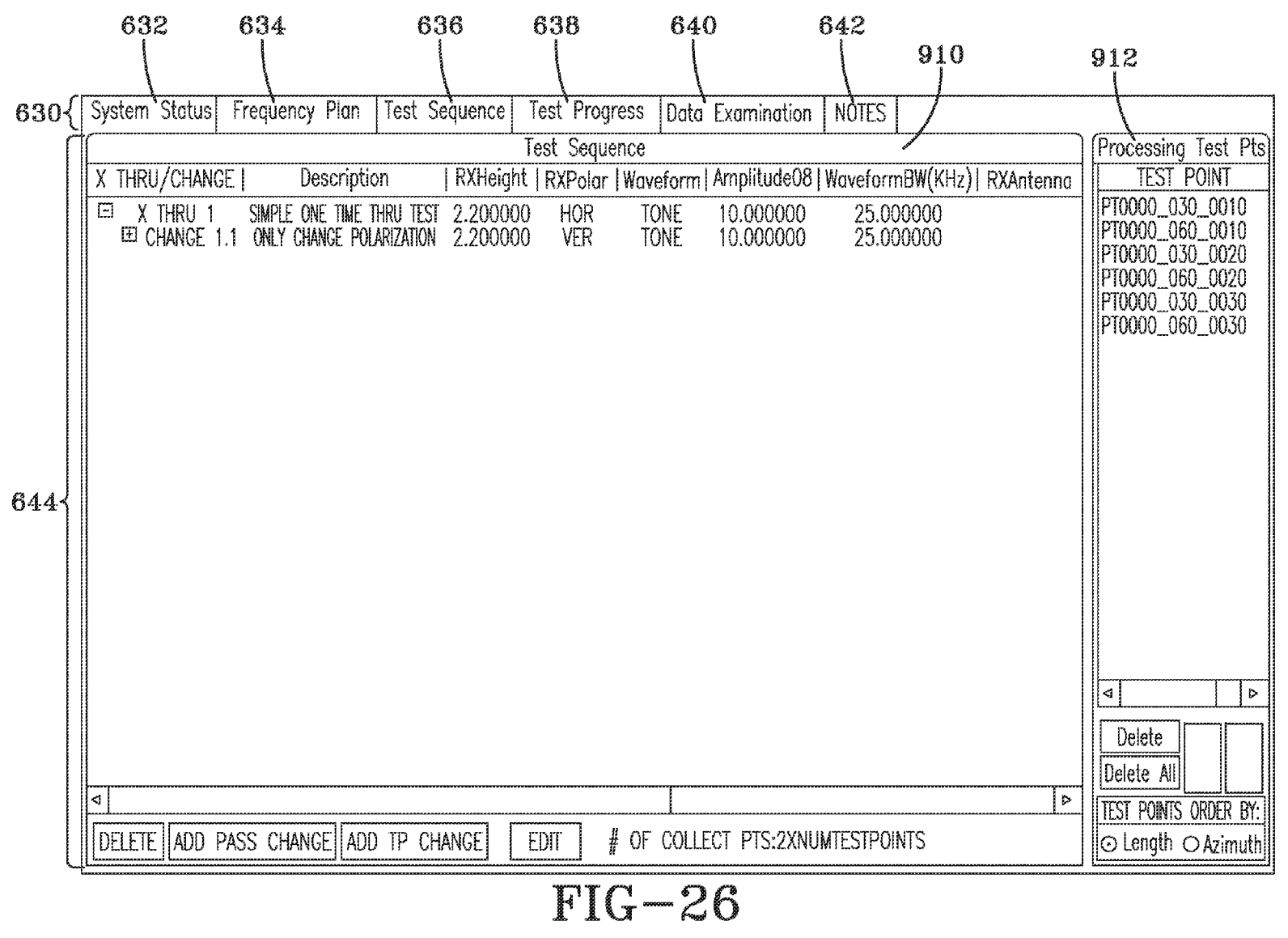

TEST RUN PARAMS — 920

TEST RUN SYNC
- ○ GPS DRIVEN
- ⊙ EVENT DRIVEN

POINTS PER FREQ
[ 0 ▲▼ ]
CONTINUOUS TILL STOP

SIGNAL SOURCES
- ⊙ SIGNAL GENERATOR
- ○ TX SYSTEM

DATA CALCULATION METHOD
- ○ Average
- ⊙ Peak Hold

Peak Hold(MilliSecs)
[ 50 ]

FLOOR PARAMETERS

NUM SAMPLES:
[ 2 ]

NUM DATA POINTS PER SAMPLE:
[ 5 ]

ADD TO PREVIOUS TEST RUN
[ LOAD... ]

FIG-27

| Test Point | Action # | Description | # COLL PTS | RXHeight | RXPolar |
|---|---|---|---|---|---|
| | 0 | RX CAL ACTION | | | |
| | 0.1 | TX CAL ACTION | | | |
| PT0000_030_0010 | 1 | SIMPLE ONE TIME THRU TEST | 0 | 2.200000 | HOR |
| PT0000_060_0010 | 1 | SIMPLE ONE TIME THRU TEST | 0 | 2.200000 | HOR |
| PT0000_030_0020 | 1 | SIMPLE ONE TIME THRU TEST | 0 | 2.200000 | HOR |
| PT0000_060_0020 | 1 | SIMPLE ONE TIME THRU TEST | 0 | 2.200000 | HOR |
| PT0000_030_0030 | 1 | SIMPLE ONE TIME THRU TEST | 0 | 2.200000 | HOR |
| PT0000_060_0030 | 1 | SIMPLE ONE TIME THRU TEST | 0 | 2.200000 | HOR |
| PT0000_030_0010 | 2 | THE NEXT TIME THRU TEST | 0 | 2.200000 | VER |
| PT0000_060_0010 | 2 | THE NEXT TIME THRU TEST | 0 | 2.200000 | VER |
| PT0000_030_0020 | 2 | THE NEXT TIME THRU TEST | 0 | 2.200000 | VER |
| PT0000_060_0020 | 2 | THE NEXT TIME THRU TEST | 0 | 2.200000 | VER |
| PT0000_030_0030 | 2 | THE NEXT TIME THRU TEST | 0 | 2.200000 | VER |
| PT0000_060_0030 | 2 | THE NEXT TIME THRU TEST | 0 | 2.200000 | VER |

METHOD AND SOFTWARE FOR SPATIAL PATTERN ANALYSIS

CROSS-REFERENCE TO RELATED APPLICATIONS

The present divisional application claims priority to U.S. patent application Ser. No. 12/347,659 filed Dec. 31, 2008 titled "METHOD AND SOFTWARE FOR SPATIAL PATTERN ANALYSIS," which is a continuation-in-part of U.S. patent application Ser. No. 12/121,346, filed May 15, 2008, now U.S. Pat. No. 8,077,098, issued on Dec. 13, 2011, the disclosures of which are incorporated by reference herein in its entirety.

STATEMENT REGARDING FEDERALLY SPONSORED RESEARCH OR DEVELOPMENT

The invention described herein was made in the performance of official duties by employees of the Department of the Navy and may be manufactured, used, licensed by or for the United States Government for any governmental purpose without payment of any royalties thereon.

FIELD OF THE INVENTION

A system and method is provided that relates to automated test systems, and more particularly to a highly automated test system for the purpose of pattern testing of antenna systems.

BACKGROUND

High performance antennas are becoming increasingly prevalent as spacecraft, aircraft, ship, and ground vehicle mission requirements become more sophisticated. In particular, greater precision in simulation and design of antennas, transmitters and end items antennas and transmitters are mounted upon is needed for a variety of reasons.

One problem in the development and manufacture of antennas is the accurate measurement of antenna performance. Traditionally, antenna performance measurement was conducted by placing the antenna at a remote location and measuring the amplitude response characteristics as a function of orientation of the antenna throughout its operational range. Required measurement distances for high gain antennas range from fifty feet to three miles or more. This measurement technique, known as far-field testing, suffers from significant practical limitations, such as susceptibility to the effects of weather, ground reflections, and increasing real estate costs.

Near-field testing was developed as an alternative to far-field testing. A typical near-field measurement system consists of three primary subsystems: a computer, a robotic positioner, and a probe. The computer provides the user interface and controls the operation of the probe. In addition, it commands the robotic positioner which moves the antenna under test (AUT), the probe, or both, over the desired virtual surface. The probe can be used to transmit or receive a radio frequency (RF) signal to/from the AUT. Consequently, for reciprocal antennas in near-field testing, the probe can transmit or receive and the AUT performs the corresponding opposite function (receiving or transmitting). One skilled in the art will appreciate that whenever an antenna is a passive linear reciprocal device, the use of the antenna in either a transmitting situation or a receiving situation is implicit. However, when an antenna or group of antennas is combined with circuit elements that are active, nonlinear, or nonreciprocal, the pattern will likely be different between transmit and receive states and so both conditions should be tested. Examples of such cases are an adaptive antenna system and a signal-processing antenna system, conical-scanning, monopulse, or compound interferometer systems. The near-field testing equipment records the amplitude and phase of a RF signal received for a series of discrete data points across a virtual surface of an AUT. This data is transformed into a far-field pattern associated with an AUT.

The two types of testing have trade-offs. With far-field testing only amplitude measurements are required (not phase) in order to derive far-field antenna patterns. Consequently, far-field testing is generally a better choice for lower frequency antennas and simple pattern cut measurements. In contrast, both amplitude and phase measurements are required for near-field testing, making it a better choice for higher frequency antennas and complete pattern and polarization measurements. Moreover, there are significant logistical limitations.

Near-field testing typically has been conducted in an indoor test facility utilizing fixed, rigid equipment with an AUT mounted on a stable, rigid fixture. In near field testing, knowledge of the precise locations of the probe and an AUT when a discrete amplitude and phase data points are recorded is a critical element. Relative movement (e.g. vibration) between the probe and an AUT may introduce inaccuracies/errors into the process. Typically, if displacement due to relative vibration (or other position errors) exceeds $1/100$ of the RF wavelength, accuracy of the near-field test will be reduced. Therefore, near-field test systems typically employ precise positioning components in order to minimize error. This form of testing is cumbersome and expensive. First of all it requires the presence of the AUT at the test facility. Depending on the location of the antenna to be tested, the cost of its transportation to and from the test facility, and the opportunity cost while the antenna is out of service, the indoor testing process is not always a cost-effective means of evaluating an antenna. Far field testing methods also require knowledge of the location of the probe and the AUT when a discrete amplitude data point is recorded, but the need for accuracy is not as critical as with near-field testing. On the other hand, far-field testing requires large far-field test ranges, where reflections from buildings, vegetation, seasonal changes, rain, snow and ice have an effect on measurement results and repeatability of the results. For vehicle-mounted antennas, the vehicles are usually mounted on large-diameter turntables that orient the vehicle and an AUT during testing. The vehicle is not in its normal environment (over real ground), and the turntable itself can introduce error. Moreover, these large test ranges and turntables are expensive infrastructure.

Various positioning systems can be used in combination with an antenna testing system. For example, Global Positioning System (GPS) technology provides positioning information. However, traditional GPS systems used in connection with antenna test systems per se do not provide sufficient information to provide adequate testing results.

Another example of positioning systems includes Real Time Kinematics (RTK) systems, which are a particular kind of GPS in which the positional data are displayed and recorded. RTK/GPS systems can be used to improve antenna test systems in order to provide the requisite level of test precision under a wide variety of real world conditions.

SUMMARY

A method and system are provided for analyzing spatial patterns of antenna systems. In one embodiment, the method comprises the steps of inputting configuration data pertinent into a database, defining a test plan, and moving a movable object between test points. The inputted configuration data includes a parametric profile of each object involved in the test plan inclusive of a transmitting object and a receiving probe, and dimensional offsets of the transmitting object relative to the receiving probe. The defining a test plan step includes defining a plurality of test points of the transmitting object relative to the receiving probe, and a test sequence for measurement at the test points. The movable object is coupled to one of the transmitting object and the receiving probe. The method further includes the steps of implementing the test plan, determining a coordinate location of the receiving probe, storing data measured during the implementation step, and displaying a graphical user interface including a graphical representation of each object involved in the test plan and measurement progress. The implementation step includes measuring test data, a position of an object and an orientation of the object at each test point. The coordinate location of the receiving probe is determined from the measured position and orientation of the object.

DESCRIPTION OF THE DRAWINGS

The foregoing aspects and many of the attendant advantages of this invention will become more readily appreciated as the same become better understood by reference to the following detailed description when taken in conjunction with the accompanying drawings:

FIG. 13 is a listing of exemplary computer code implementing the GPS/RTK thread of FIG. 12;

FIG. 25 is a screen shot of a Frequency Plan Tab;

FIG. 26 is a screen shot of a Test Sequence Tab;

FIG. 27 is a screen shot of a Test Run Parameters Dialog;

Figure 1:
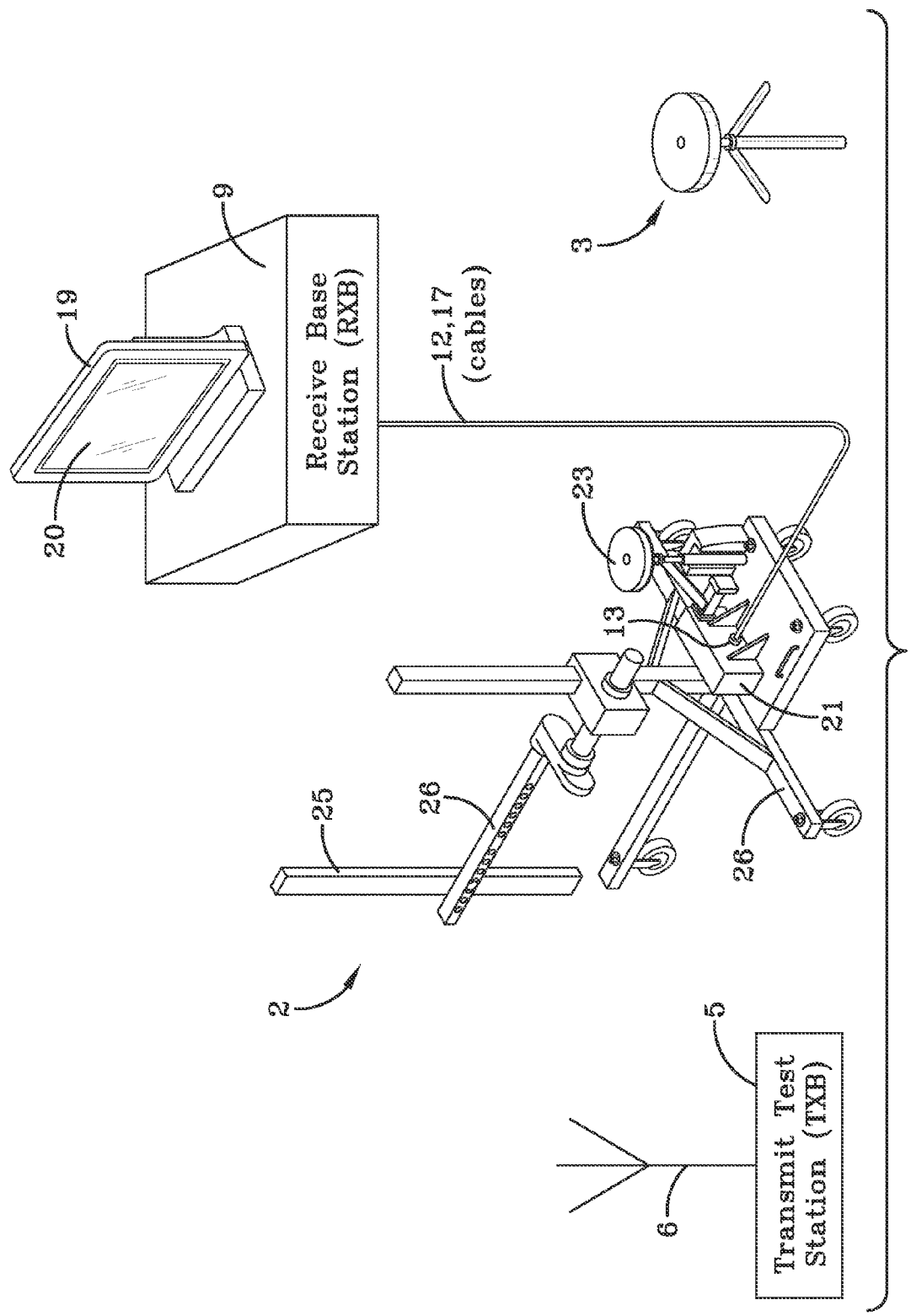
FIG. 1 is a diagram of an exemplary antenna test system (ATS)

Corresponding reference characters indicate corresponding parts throughout the several views. Although the drawings represent embodiments of various features and components according to the present invention, the drawings are not necessarily to scale and certain features may be exaggerated in order to better illustrate and explain the present invention. The exemplification set out herein illustrates embodiments of the invention, and such exemplifications are not to be construed as limiting the scope of the invention in any manner.

DETAILED DESCRIPTION

For the purposes of promoting an understanding of the principles of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention which would normally occur to one skilled in the art to which the invention relates.

A method for testing and a highly automated portable "test anywhere" test system for pattern testing of antenna systems is provided. Exemplary ATS, in accordance with the invention, quickly and accurately measure the far-field patterns of antennas and antenna/vehicle combinations. This can be done in real environments such as over dirt, grass, sand, pavement, in a town, etc. The measurements can be taken at predetermined points or on-the-fly, if unusual data indicates a need for more measurements. The collected data is then processed to calculate the gain pattern of an AUT. This can be accomplished across multiple frequencies, heights, polarizations, and distances.

In this exemplary embodiment, the main components of the ATS include a high accuracy geo-location position sensor adapted to determine and output the coordinate location data for a portion of the ATS. The invention is herein described using GPS/RTK for high accuracy geo-location, though other geo-location technologies may suffice. A multi-axis orientation sensor such as an inertial navigation unit (INU) is adapted to determine and output "multi-axis orientation" data for a portion of the ATS (e.g., high accuracy attitude and north reference). The position sensor and INU determine and output coordinate location and orientation, respectively, of portions of the ATS. An RF probe is positioned relative to an AUT to transmit/receive therewith, and emission measurements including amplitude data (and optionally phase) associated with the AUT are communicated to a receive station where they are sampled, time-stamped, associated with the time-stamped coordinate location and orientation data, and stored in a plurality of datasets (each including amplitude of a test signal to/from an AUT, coordinate location of an AUT, and multi-axis orientation data for an AUT, as well as optionally the phase of a test signal to/from an AUT for a plurality of test locations). A computer runs antenna test software that compensates the coordinate location data based on the multi-axis orientation data. Using the compensated position data and the sampled emission measurements, the computer presents a graphical user interface (GUI) that represents the AUT inclusive of an emission pattern representation comprising a plurality of signal characteristics.

FIG. 1 is a diagram of an exemplary ATS. A Transmit Test Station (TXB) 5 is connected to an AUT 6, the TXB 5 being responsible for the generation and control of test signals, and the AUT 6 transmitting the test signals generated thereby. The test system also employs a roving test station 2 (hereinafter "rover") equipped with an RF probe 25 which in this embodiment is for reception of the test signals from an AUT 6. The rover 2 also includes a GPS/RTK position sensor 23 and INU 21 mounted on an equipment tray 26. The system also includes a conventional RTK base station 3 which generates an RTK correction signal to the GPS/RTK position sensor 23 for improving the accuracy thereof. The RTK base station 3 will typically be placed 200-300 meters from the rover 2, though it can range up to six miles. The RTK base station 3 can be replaced by an RTK reference station which provides a fixed site reference which provides higher accuracy and longer range. The test signals transmitted by the AUT 6 are received at RF probe 25 and communicated by cable 17 to a Receive Base Station (RXB) 9. Likewise, coordinate and orientation data from GPS/RTK position sensor 23 and INU 21 in rover 2 are communicated through serial communication server 13 and cables 12 to the RXB 9. The RXB 9 time-stamps and records the test signals along with coordinate and multi-axis orientation data, processes them, and analyzes those signals. For that analysis, the RXB 9 includes a computer that runs ATS software and provides a GUI 20 on display 19 that allows an operator to define test scenarios, equipment configurations, test sequences, and frequency plans and presents the information in a spatially representative display. ATS software determines highly accurate probe position-location and orientation information in order to determine the desired spatial pattern data for an AUT with greater consistency. The rover 2 is described in more detail below with reference to FIGS. 16-17.

The rover 2 can be used to track movement of various ATS components which are moving during testing. Thus, given the illustrated configuration with a stationary AUT 6 (and its support equipment), an AUT 6 position is collected at the beginning of the test for spatial representation throughout the test. Rover 2 can then track position and orientation of RF probe 25 and record data related to such tracking. Similarly, given a stationery RF probe 25 and moving AUT 6 configuration, then the rover 2 will track the AUT 6 position and orientation. RF probe 25 is mounted on a mast 24 which may be adjusted to change the location and orientation of the RF probe 25 without moving the rover 2. Optionally, the mast 24 may comprise the arm of a 6-df robot, for instance, in which case the location and orientation of the RF probe 25 may be remote-controlled. Furthermore, the rover 2 may comprise mechanical devices adapted to move the rover 2 from its present location to a test point location based on directional information provided by the ATS software which is based on test points and test sequences inputted by an operator. Exemplary mechanical devices include analog or digital motors and drives adapted to move one or more of the rover 2 wheels. Alternatively, a display device may be utilized to display positioning instructions. An exemplary device, show in FIG. 2, may be a personal digital assistant such as a PDA 27.

The ATS software time-stamps all the information collected from the rover 2 including information from position sensor 23 and INU 21, and analyzes the time-stamped data to calculate position and orientation of the AUT 6 relative to the RF probe 25. Via GUI 20, the ATS software provides test personnel a graphical situational awareness view of the test range, vehicles, testing points and all test equipment that makes up the ATS. The ATS software also allows automated control of all test equipment with minimal user input, gathers all or selected pertinent test data and waveforms, and stores all relevant test information electronically for later examination and post processing. Simulations of one or more AUTs in combination with various mounting structures such as vehicles can later be run based on stored data to eliminate a need to return to a test location to re-run the test.

Figure 2:
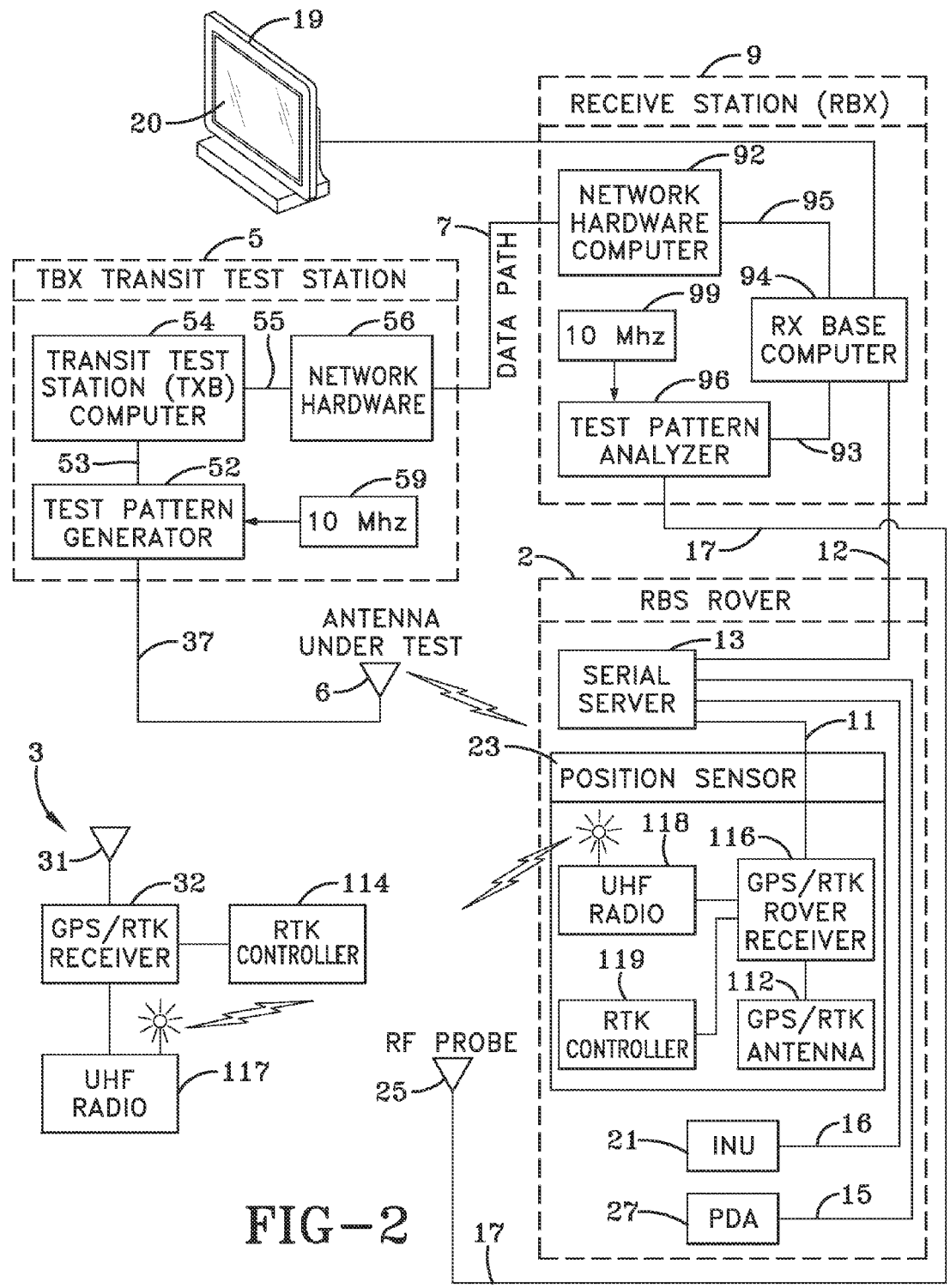
FIG. 2 is a component level diagram of an exemplary ATS such as the ATS in FIG. 1.

FIG. 2 shows an exemplary component level diagram of an ATS. TXB 5 is responsible for generation and control of test signals, and AUT 6 transmits the test signals generated by the TXB 5. The TXB 5 further comprises a TXB test pattern generator 52 connected by means of cable 37 to the AUT 6. TXB 5 also includes a TXB computer 54 for automatic control of the TXB test pattern generator 52, and TXB network hardware 56 for allowing the TXB computer 54 to communicate with a RXB 9. In this manner, an ATS software running in the RXB 9 can automatically control and implement all test frequency generation. The test pattern generator 52 may be any programmable RF test frequency generator, such as an Agilent™ 81110A pulse/pattern generator or a LabVIEW NI PXI-5671 generator.

A TXB computer 54 may be a conventional laptop computer or programmable controller running an ATS transmit software module. The ATS transmit software module of the TXB computer 54 handshakes with the main ATS software at RXB 9 for automated control of the TXB test equipment and situational awareness of the ATS components. A TXB computer 54 can be connected to a test pattern generator 52 by a data path 53 and to the TXB network hardware 56 by means of a data path 55. The TXB and RXB network hardware 56, 92 provide connectivity between the TXB computer 54 and the RX computer 94 in the RXB 9 by means of a data path 7. The TXB and RXB network hardware 56, 92 may be, for example, secure encrypted communications wireless Ethernet cards, though one skilled in the art should understand that the network connectivity hardware may change due to range, signal level, or level of encryption needed.

The RXB 9 may comprise a conventional computer system or processor running the ATS software (to be described), and including a conventional user interface (display 19 and input devices such as keyboard, mouse, etc.) for use with the GUI 20 generated by the ATS software. The exemplary RXB 9 captures and analyzes test signals and coordinates the software between RXB computer 94 and TXB computer 54. The RXB computer 94 runs the main ATS receive software module for automated control of the RXB test equipment and situational awareness of all of the ATS transmit or receive components. The RXB computer 94 can be connected to the test pattern analyzer 96 by means of a data path 93 and to the RXB network hardware 92 by means of a data path 95. The test pattern analyzer 96 may be, for example, an Agilent™ spectrum analyzer. The test pattern analyzer 96 captures a test signal from the RF probe 25 via the RF cable 17. However, the connections may also be wireless.

A common reference signal supplied to both the TXB test pattern generator 52 and test pattern analyzer 96 can provide more accurate frequency, amplitude and phase measurements. For this purpose, 10 MHz reference devices 59, 99 are connected to the test pattern generator 52 and the test pattern analyzer 96, respectively. In the example, the 10 MHz reference devices are GPS reference receivers which receive a GPS signal and produce the 10 MHz reference signal based on a rising edge of the GPS signal.

The RXB computer 94 is connected via a serial server 13 in rover 2 to the GPS/RTK position sensor 23, the INU 21 and a PDA 27. The GPS/RTK position sensor 23, the INU 21, and the PDA 27 have output ports, RS232 or RS422 serial outputs for instance, which are connected to serial server 13 by means of data paths 11, 16, 15, respectively, and output data through the output ports. Serial server 13 converts the output data into a single Ethernet output over data path 12 to establish communications with RXB computer 94. The data paths 11, 15 and 16 may optionally be wireless such as an UHF radio.

The above-described configuration may be employed for different testing scenarios. For example, the AUT 6, TXB 5, RXB 9, and GPS/RTK base station 3 may be stationery while the rover 2 with RF probe 25 is mobile. Alternatively, the RF probe 25 may be stationery while the rover 2 with the AUT 6 is mobile. This allows the generation of the antenna patterns where there is only a limited area of interest to reflect such as, for example, over a concrete road or a city street with adjacent buildings. This approach also provides a method to determine the effect of a concrete road or city street over all aspects of the vehicle.

An RTK-based ATS can provide highly accurate positional information (1 cm horizontal and 2 cm vertical) for manipulation by ATS software. The INU can provide highly accurate orientation information (0.5 degrees or less) for manipulation by the ATS software as well. A user can select through the ATS software a reference point on an RF probe 25 connected to the equipment tray 26 and can change or preload different RF probe parameters corresponding to different RF probes. The PDA 27 has a graphical interface which provides navigational and directional instructions to a user for moving and positioning the mast 24, and RF probe 25, to testing locations including predetermined test points. The PDA 27 GUI can display distance and vector information as well as elevation or other spatial references. The PDA 27 may be connected to the serial server 13 by a RS232 or RS422 cable and then on to the RXB 9 by an Ethernet cable. The software resident on the RXB computer 94 of the remote RXB 9 may also automatically communicate with the rover's GPS and robotically move the mast 24 in which case the PDA 27 is unnecessary.

The INU 21 comprises any inertial navigation unit that provides highly accurate azimuth, pitch, and roll data and a north or direction reference for the rover 2. Celestial navigation systems could also be used with the INU system or to replace it. The INU 21 is in serial communication with the on-board serial server 13 which establishes a data path 12 to the RXB 9.

The RTK base station 3 and the GPS/RTK position sensor 23 comprise communication components to communicate an RTK correction signal between them. The components include the GPS/RTK receivers 32, 116, UHF radios 117, 118, GPS/RTK antennas 31, 112, and RTK controllers 114, 119. Indeed, the RTK controllers 114, 119 are redundant. An RTK controller may be used first on RTK base station 3 to activate it, and then moved to the rover 2 to bring that up and verify communications. The GPS components used in this embodiment of the rover 2 are GX1230GG receivers, coupled to AX1202 antennas, RX1200 controllers, and the Intuicom DL1200 Data Link Radio, respectively. The GPS/RTK Position sensor 23 assembly may also comprise a Leica SmartRover™ RTK Global Satellite Navigation System (GNSS) system, or a Trimble™ integrated 5800 GPS receiver.

ATS software can pre-generate a test pattern including virtual test points and a variety of frequency plans. The test pattern can then be taken to the testing range and implemented using a rover 2 to generate test data or representations. In one embodiment, given a pre-generated test pattern, as soon as a reference point (in this case for an AUT 6) is measured, the ATS software calculates real position coordinates of the virtual test points. The RF probe 25 then captures an RF test signal emitted by the AUT 6 at one or more known real position coordinates. The RXB 9 can record amplitude (and optionally phase) of the received RF signal for a series of test points across a virtual test pattern of an AUT 6 and timestamp each data point. In addition, at each test point the GPS/RTK position sensor 23 and the INU 21 provide position and orientation data which is combined in a data set with time-stamped amplitude (and optional phase) data. Test point data can be collected along a plane located one or more, e.g., two to five wavelengths, in front of the AUT 6, or along a surface representing a volume, such as a cylinder or sphere, that encloses the AUT 6 to support/allow near field test pattern analysis.

In operation, a user will enter known (measured) dimensional offsets based on the GPS and RF probe 25 mounting (e.g., the physical configuration of hardware) during a test setup phase. The offsets establish the dimensional relationships between the sensors and the transmitting and receiving objects such that when the receiving and/or transmitting objects are moved during testing, the dimensional offsets permit precise re-calculation of the actual positional and orientational relationship between them based on newly acquired sensor data. As such, the known (measured) offset data will be associated with at least one portion of the test system such as for example coordinates or distance from GPS antenna 112 to RF probe 25 or a test location characteristic, etc. This user defined offset data becomes the basis for determining by mathematical computations using a rotation matrix the coordinate locations of the test system and an RF probe 25. Then during actual testing the RTK/GPS rover receiver 116 determines the position of the rover 2, and this information is passed to the RXB 9. The RTK base station 3 generates the RTK correction signal and provides the correction signal to the rover 2 for the purposes of providing more accurate position information. The corrected position information is processed by the rotational matrix so that measured orientation data, e.g., azimuth, pitch and roll, is modified in accordance with the known offsets to produce adjusted or compensated orientation data associated with the rover 2. Using this approach, GPS sensor data can be determined and applied to modified offsets to determine an antenna's actual position, azimuth, pitch and/or roll at a given point of time.

Figure 3:
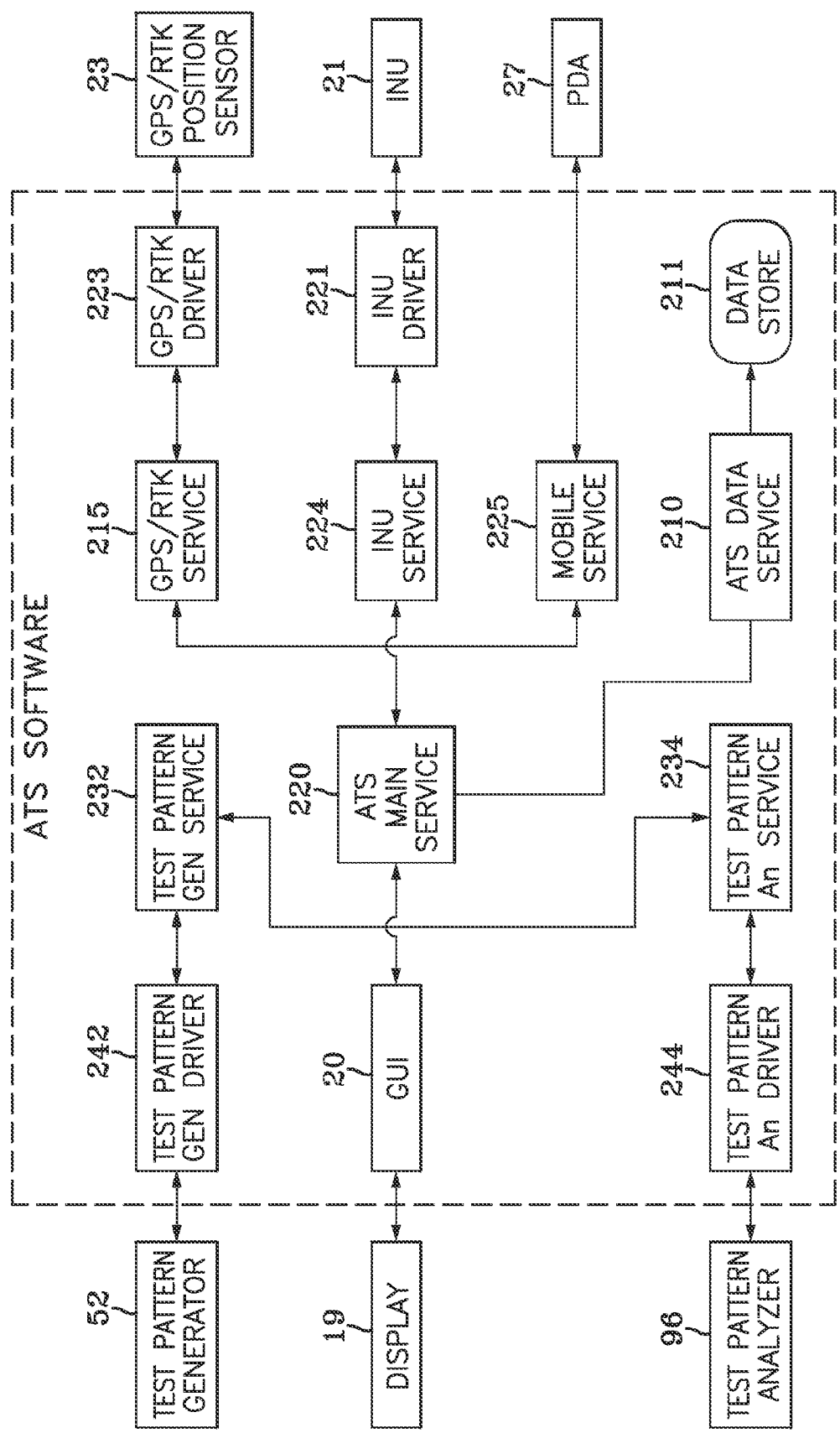
FIG. 3 is an exemplary block diagram of ATS software.

FIG. 3 is an exemplary block diagram illustrating one basic layout of the ATS software main server package which runs on the RXB 9. This embodiment of the ATS software comprises the core ATS Main Service 220, and a plurality of service modules communicating with the ATS Main Service 220. In these embodiments, the term "server" can refer to a software implementation having various services or functions, however other embodiments can employ a hardware server or a combination of hardware and software. Communication can be accomplished over an IP based network (wired or wireless), and data and command messages are passed across this network. The services then communicate with their respective drivers and sensor devices using device specific commands and data structures.

In this embodiment, ATS Main Service 220 is a communication hub for service modules, or services, and for the ATS display 19 and GUI 20. A configuration program is used to configure the service modules via the GUI 20. Six services are shown, four services for communicatively coupling ATS Main Service 220 to devices through device drivers, and the remaining two services for coupling to the PDA 27 and a data store 211. Test Pattern Gen Service 232 couples to Test Pattern Gen Driver 242, Test Pattern An Service 234 couples to Test Pattern An Driver 244, GPS/RTK Service 215 couples to GPS/RTK Driver 223, and INU Service 224 couples to INU Driver 221. Mobile service 225 couples to PDA 27 and ATS Data Service 210 couples to data store 211.

The test pattern generator 52 and test pattern analyzer 96 both can communicate through their respective drivers 242, 244 which are written to conform to the equipment manufacturer specifications, and these drivers use device specific commands and data structures. The same is true of the GPS/RTK position sensor 23 and INU 21, which can communicate through their respective drivers 223, 221. INU Service 224 interacts between the INU Driver 221 and the ATS Main Service 220. It is possible to have multiple INU Services 224 running to accommodate multiple INUs 21. Each INU Service 224 has an instance number assigned to it, and those instances are attached to the INUs 21. The ATS GPS/RTK Service 215 interacts between the GPS Driver 223 and the ATS Main Service 220. It is possible to have multiple GPS/RTK Services 215 if there are multiple GPS devices. Each service has an instance number assigned to it, and those instances are attached to the various GPS/RTK sensors 23.

The Test Pattern Generator Service 232 interacts between the Test Pattern Generator Driver 242 and the ATS Main Service 220, and the Test Pattern Analyzer Service 234 interacts between the Test Pattern Analyzer Driver 244 and the ATS Main Service 220. In this embodiment, only one Test Pattern Generator Service 232 and one Test Pattern Analyzer Service 234 may run.

The Mobile Service 225 couples the ATS Main Service 220 with mobile means to move, or direct movement of, the mast 24. Mobile Service 225 may provide navigation information to the PDA 27 to assist the user in moving the mast 24, and may also communicate, through a suitable driver, with a mast positioning robot (not shown).

The ATS Data Service 210 manages the storage and retrieval of all system data, test data, and configuration information in the data store 211 which comprises a collection of databases, for example Microsoft Access™ databases. In addition, Microsoft Excel™ may be used to apply post-processing steps and to pull test data results from the ATS databases.

In order to use the ATS, the user first employs the ATS Main Service 220 to create virtual system devices based on ATS hardware components and set and modify parameters for those devices such as tolerances, offsets, position location, etc. The user also may establish a test area where testing is to occur. The user then attaches the virtual devices to their hardware counterparts, initializes the proper software modules including the ATS Main Service 220, GPS/RTK Service 215, and INU Service 224, and runs the test.

The ATS Main Service 220 employs a socket and thread architecture to attach the devices to their hardware counterparts. All commands, or processing instructions, are handled by the ATS Main Service 220, while the threads are responsible for receiving data from the port connections. A socket has been defined, for simplicity, as a combination of an IP address and a port number. Each socket is mapped to an application process or thread which acts as a socket server. Here, each socket digitally associates the ATS Main Service 220 with a specific hardware port on the machine where it runs. Services with sockets associated with that same port can communicate with the ATS Main Service 220.

Figure 4:
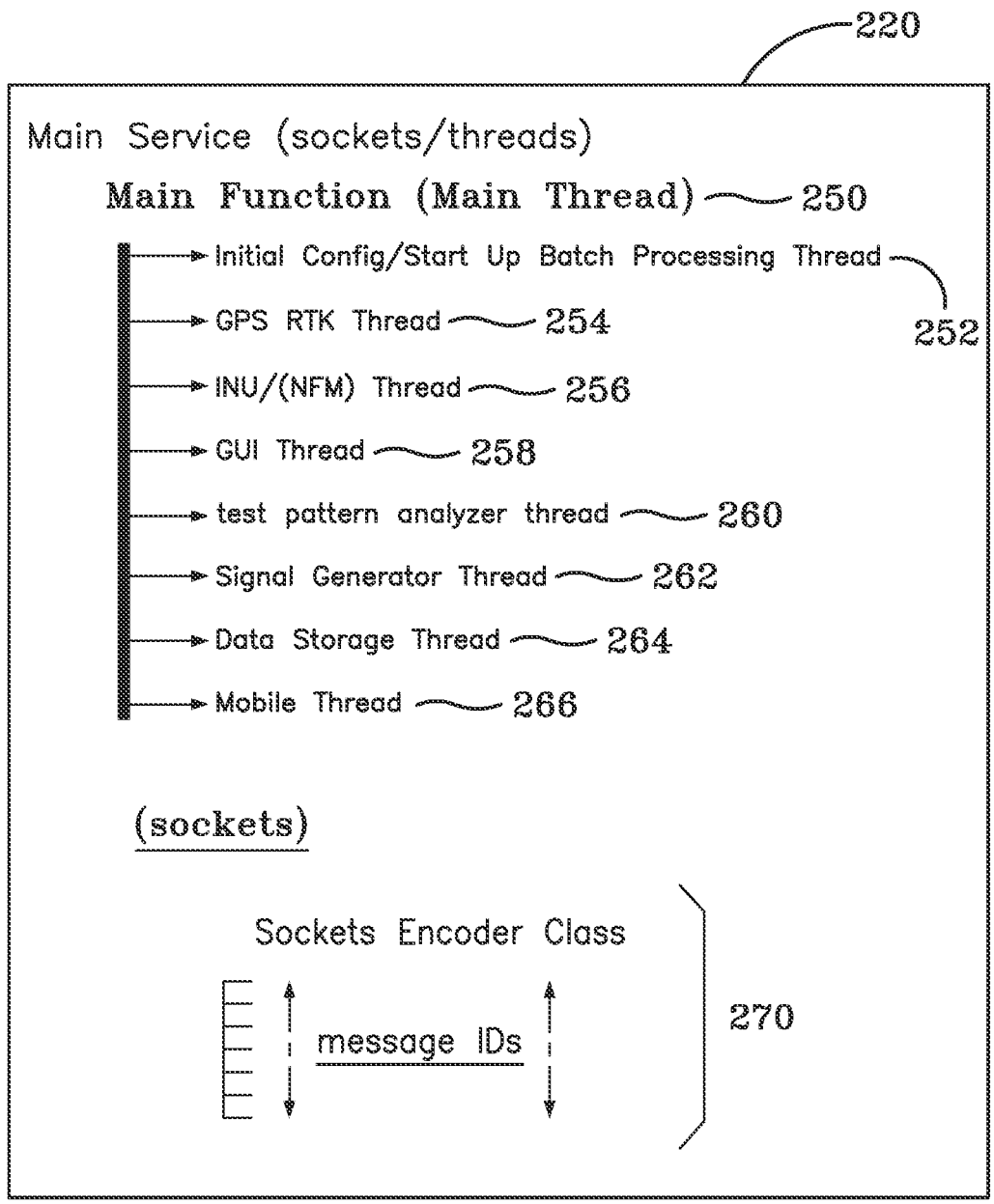
FIG. 4 is a flow chart of the ATS software socket and thread architecture.
Figure 5:
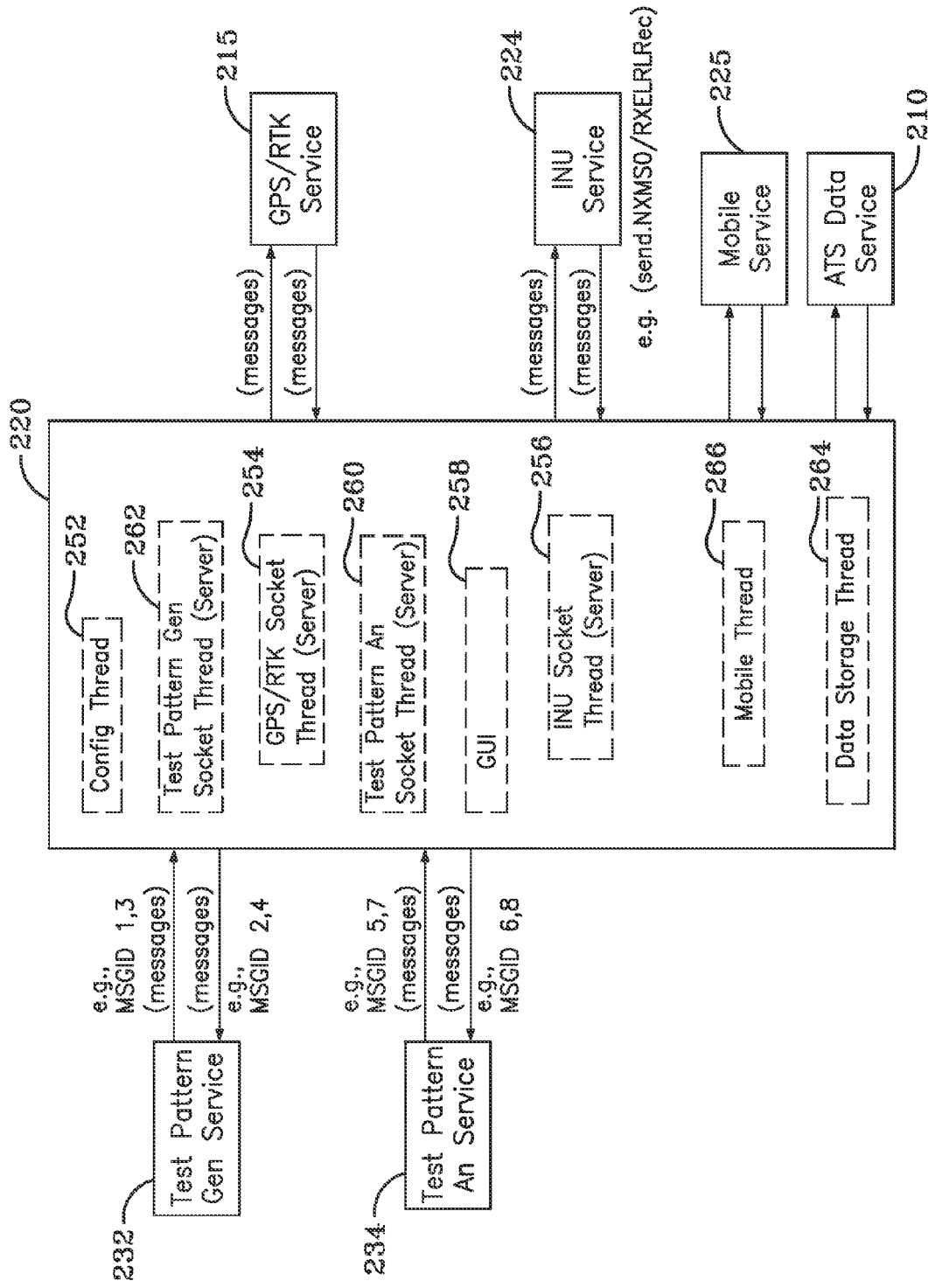
FIG. 5 is a block diagram of the communication flow in the socket and thread architecture of FIG. 4.
Figure 6:
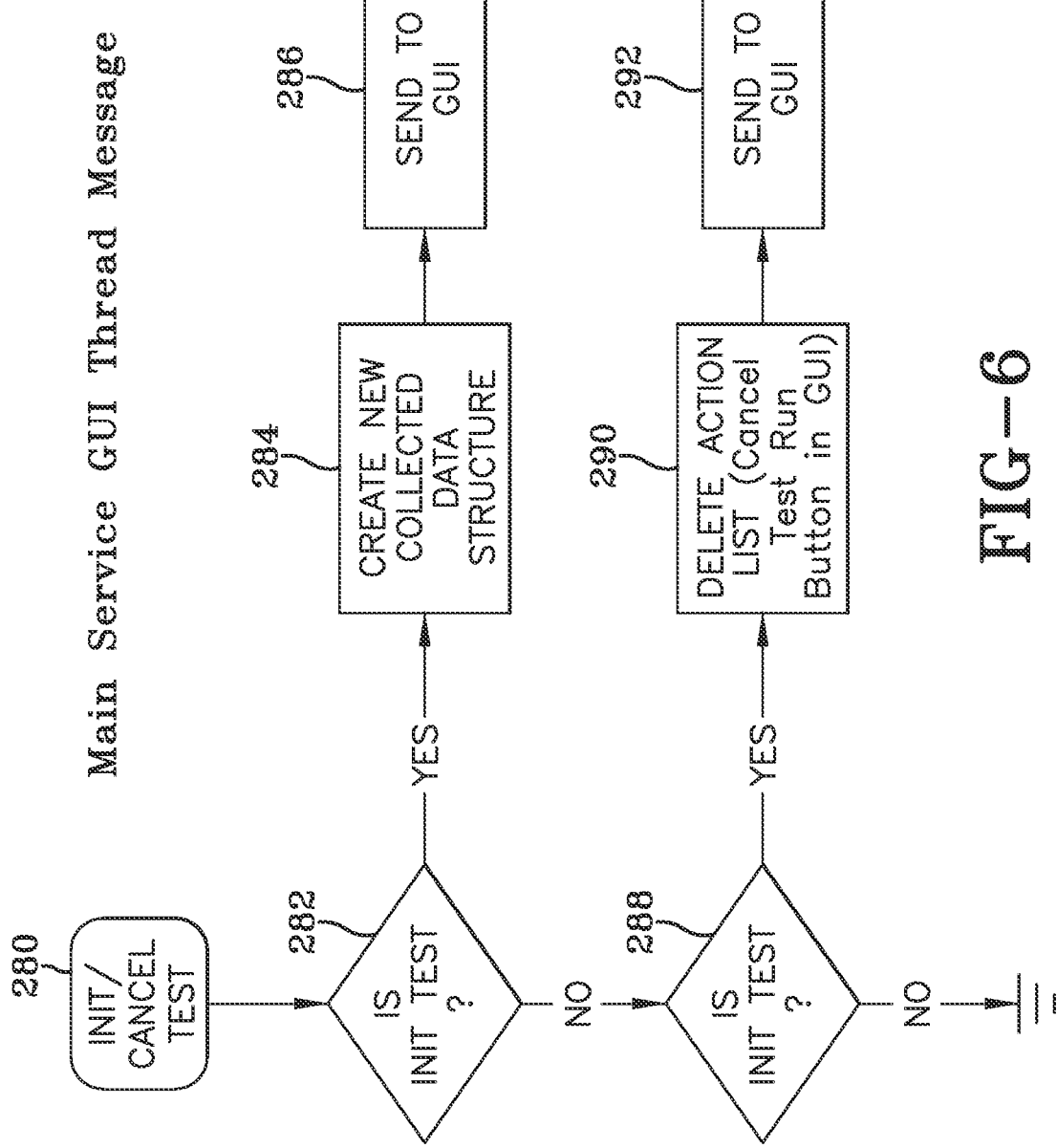
FIG. 6 is an exemplary flowchart a GUI thread.
Figure 7:
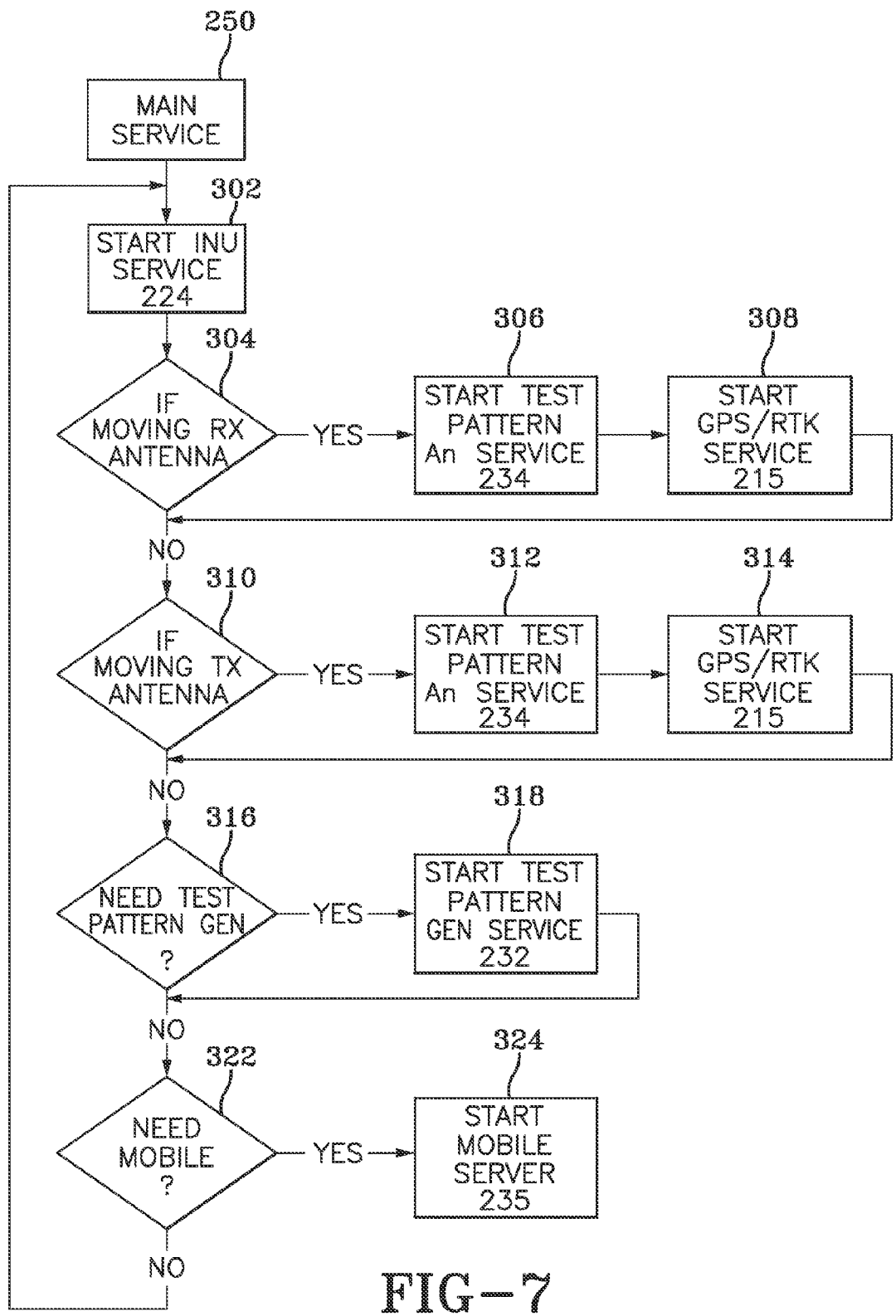
FIG. 7 is a flow chart of an ATS main thread.
Figure 8:
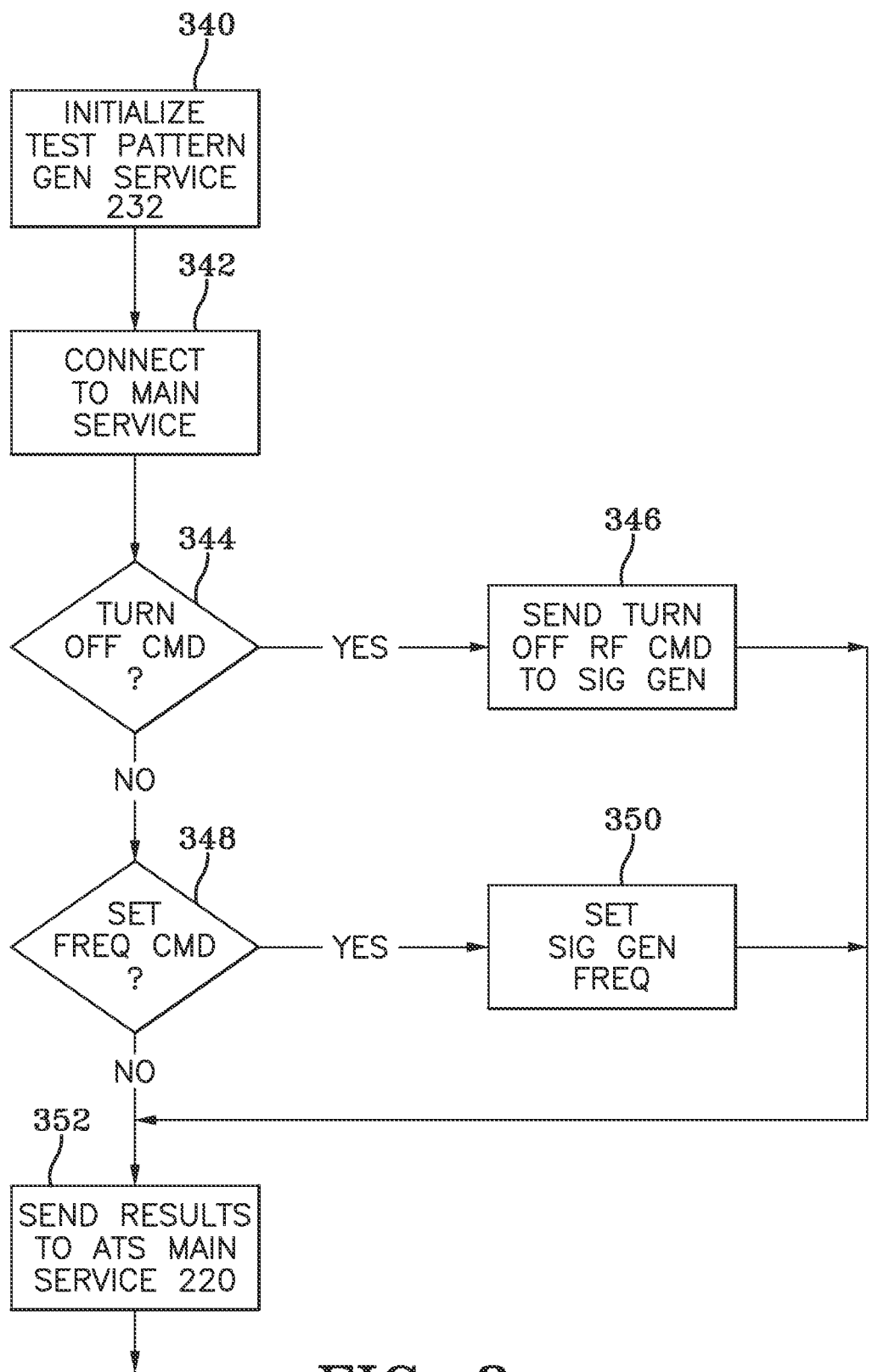
FIG. 8 is a flow chart of an exemplary Test Pattern Generator Service.
Figure 9:
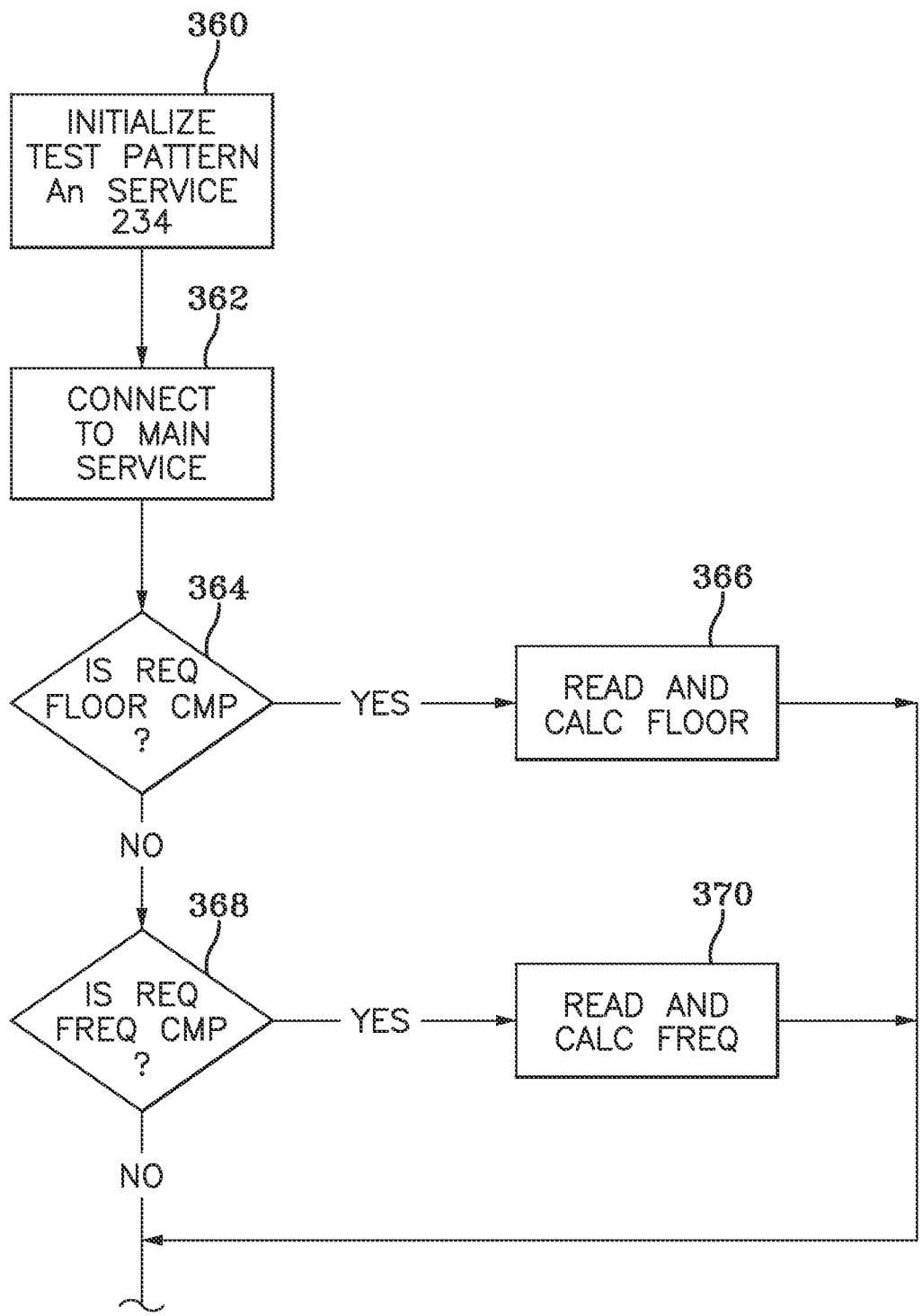
FIG. 9 is a flow chart of the Test Pattern Analyzer Service.
Figure 10:
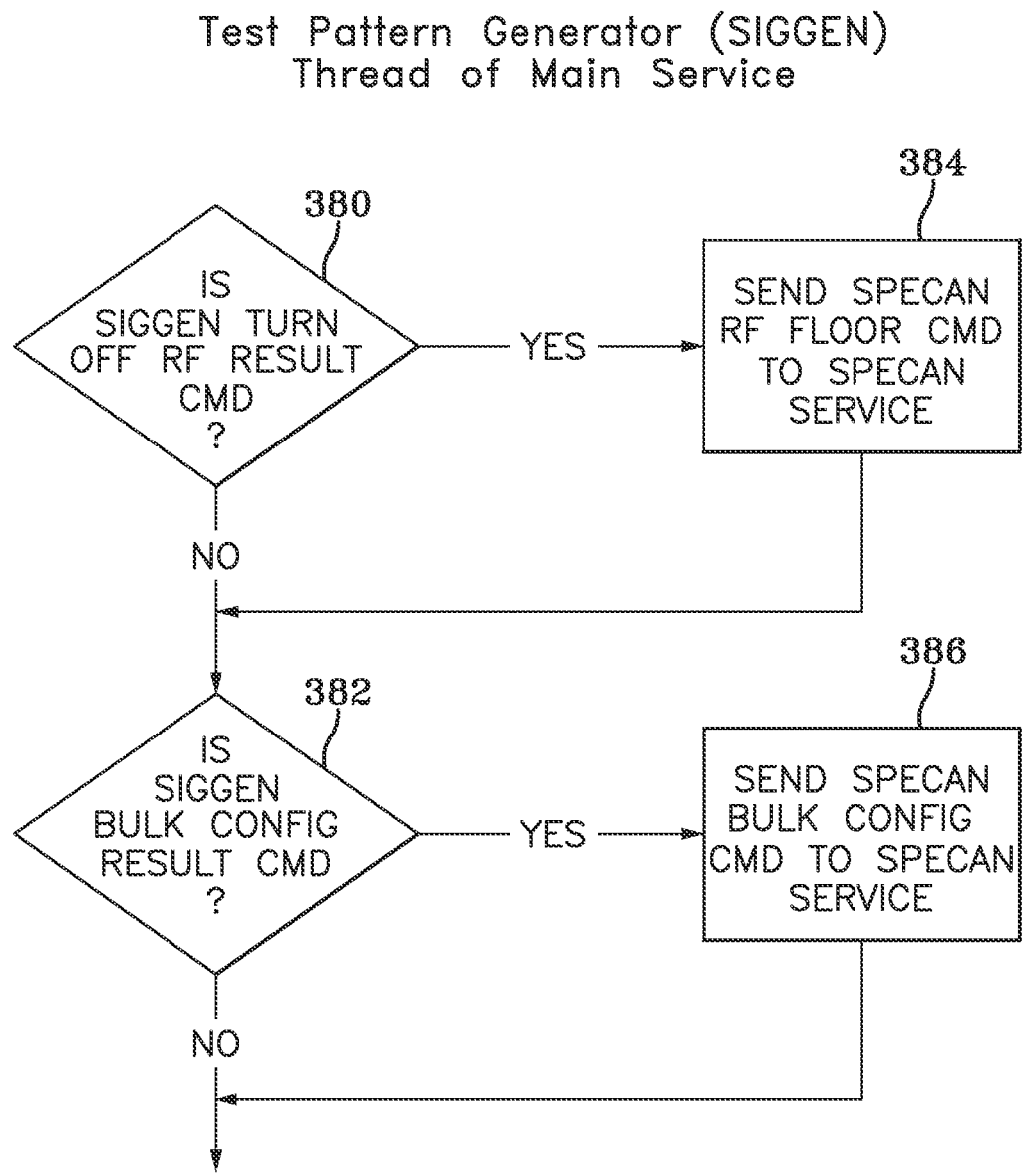
FIG. 10 is a flow chart of a Test Pattern Generator thread.

FIGS. 4-5 describe conceptually the ATS Main Service 220 which comprises a main thread and six threads associated with the six services described in FIG. 3. FIGS. 6-7 are flow charts which illustrate steps in the main thread. FIGS. 8-10 are flow charts which illustrate Test Pattern Services 232, 234 and the Test Pattern Gen tread 262.

FIG. 4 is a functional chart illustrating the threads of the ATS Main Service 220. The ATS Main Service 220 initiates an initial process thread or main thread 250 which creates worker threads to handle requests for socket connections coming in from the services. Threads include a configuration thread 252, GPS/RTK thread 254, INU thread 256, GUI thread 258, test pattern analyzer thread 260, signal generator thread 262, data storage thread 264 and mobile thread 266. Asynchronous sockets use threads from a system thread pool to process incoming connections. All socket messages are sent with a unique message ID, and each message ID includes an identifier/pointer to identify the thread that the message came from. A socket encoder class 270 maintains SSL channel encryption.

FIG. 5 illustrates the socket/thread bidirectional communication flow between the service modules and the ATS Main Service 220. Message IDs can include a data string with data to trigger actions and pass data. For example, the Test Pattern Gen Service 232 may receive a message from the ATS Main Service 220 through Test Pattern Gen thread 262 having a message ID 2 and requesting turn-off the test pattern generator 52. The Test Pattern Gen Service 232 will turn off, via test pattern Gen Driver 242, the test pattern generator 52 and send a return message having a message ID 3 confirming the test pattern generator 52 is off. Similarly, the ATS Main Service 220 communicates with the other devices to control drivers and hardware. A similar messaging pattern is used to configure hardware before performing tests.

FIG. 6 shows an exemplary thread message to GUI 20. At 280, the ATS Main Service receives user inputs to initialize or cancel a test. At step 282, it checks if it is initializing a new test. If so, at 284 the GUI thread 258 creates a new collected data structure and at 286 it sends it to the GUI 20. At step 288, it checks if it is canceling a test. If canceling a test, at 290 the GUI thread 258 generates a cancel test run button. At 292, it sends it to the GUI 20.

FIG. 7 is a service initialization flow chart where the main thread 250 initiates various services. At step 302, the main thread 250 initiates the INU Service 224. At step 304, it checks if the test involves moving the RX antenna. If so, at step 306 a Test Pattern An Service 234 is initiated and at step 308 a corresponding GPS/RTK Service 215 is initiated. At step 310, it checks if the test involves moving the TX antenna. If so, at step 312 a Test Pattern An Service 234 is initiated and at step 314 a corresponding GPS/RTK Service 215 is initiated. At step 316, it checks if a new test pattern is needed. If so, at 318 a Test Pattern Gen Service 232 is also started. Finally, at 322 it checks if mobile service is required. If so, at step 324 the Mobile Service 225 is initiated.

FIG. 8 is a flow chart of the Test Pattern Gen Service 232. At step 340 the Test Pattern Gen Service 232 initializes, and at step 342 it connects to the ATS Main Service 220. At step 344 the Test Pattern Gen Service 232 checks whether a "turn-off" command was provided by an operator via GUI 20, and if so, at step 346 the Test Pattern Gen Service 232 emits a turn-off command to the Test Pattern Gen Driver 242. At step 348 the Test Pattern Gen Service 232 checks whether the operator provided a "set frequency" command, and if so at step 350 the Test Pattern Gen Service 232 emits a set frequency command to the Test Pattern Gen Driver 242. At step 352 the results of the Test Pattern Gen Service 232 programming are sent back to the ATS Main Service 220.

FIG. 9 is a flow chart of the Test Pattern An Service 234. The service calculates test patterns based on floor and frequency parameters. Floor parameters are the number of samples and number of data points to be collected per sample in a pattern. Each pattern may be run at a number of predetermined frequencies. At step 360 the Test Pattern An Service 234 initializes, and at step 362 it connects to the ATS Main Service 220. At step 364 the Test Pattern An Service 234 checks whether the floor parameters have been entered into the GUI 20. If so, at step 366 these values are sent to the Test Pattern Analyzer Driver 244 for data collection. At step 368 the Test Pattern An Service 234 checks whether the Frequency Parameters were provided. If so, at step 370 these values are sent to the Test Pattern Analyzer Driver 244 for data collection.

FIG. 10 is a flow chart of the Test Pattern Generator thread 262. At step 380 the Test Pattern Generator thread 262 checks whether the test pattern analyzer 96 is on using the command "Is SIGGEN_Turn_Off RF_Result_CMD?" If not, at step 384 the RF_Floor Command is sent to the test pattern analyzer service 234. At step 382 the Test Pattern Generator thread 262 checks whether the test pattern analyzer 96 is configured using the command "Is SIGGEN_Bulk_Config_Result" If not, at step 386 the Send Specan_Bulk_Config_CMD command is sent to the Test Pattern An Service 234.

FIGS. 11-15 are charts which illustrate the GPS/RTK Service, thread and message structure and the INU Service 224 and thread which are involved in procurement of parametric data necessary to compensate the test data. The compensation process is described in more detail with reference to FIGS. 16-18.

Figure 11:
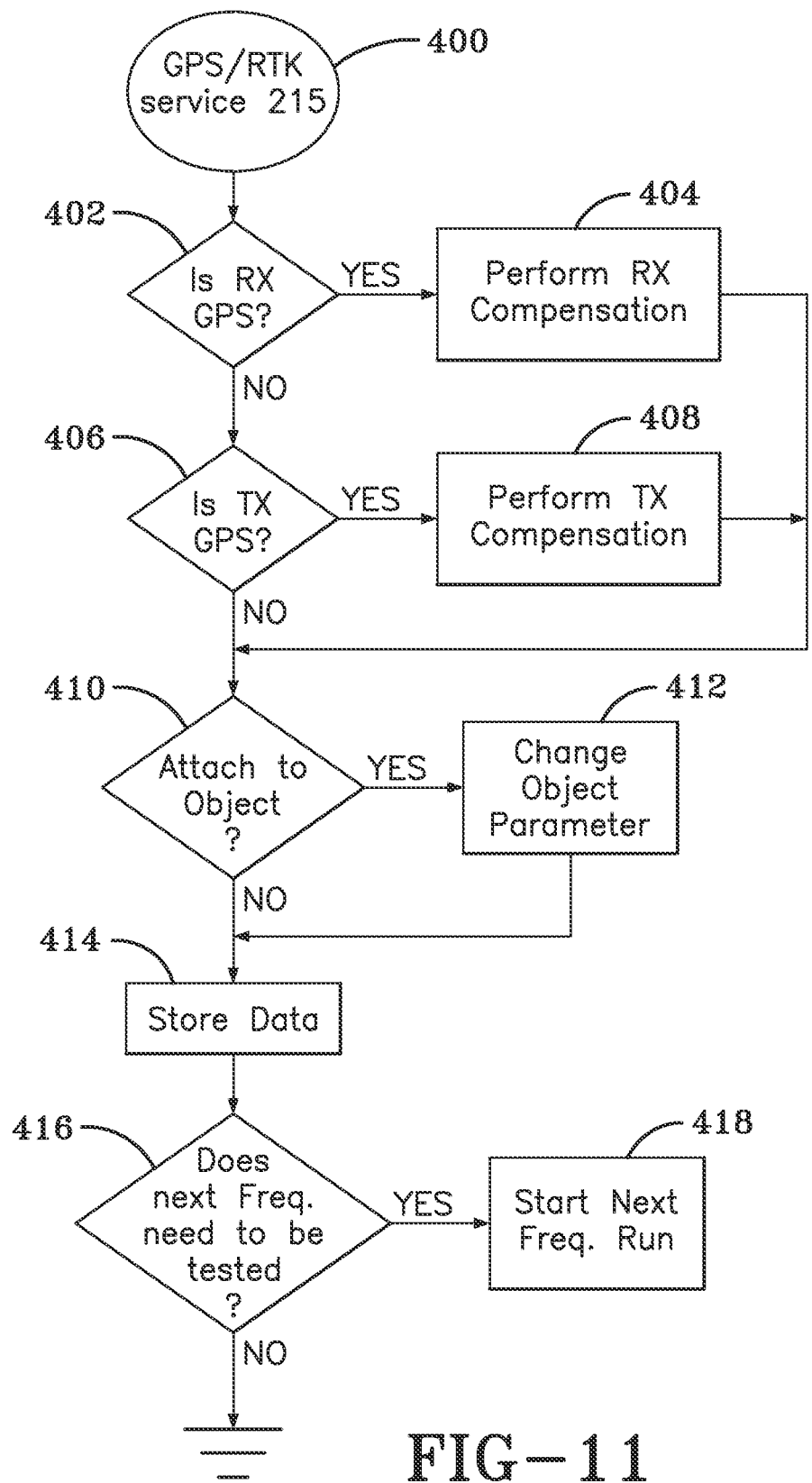
FIG. 11 is a flow chart of a GPS/RTK service.

FIG. 11 is a flow chart of the GPS/RTK Service 215. At step 400 the GPS/RTK Service 215 initializes, and in this example at step 402 it determines from the ATS Main Service 220 whether the GPS/RTK position sensor 23 is attached to the RF probe 25. If so, at step 404 the GPS/RTK Service 215 calculates the RX offsets. Similarly, at step 406 the GPS/RTK Service 215 determines from the ATS Main Service 220 whether the GPS/RTK position sensor 23 is attached to the TX antenna. If so, at step 408 the GPS/RTK Service 215 calculates the total offsets ($X_{totaloffset}$, $Y_{totaloffset}$, $Z_{totaloffset}$) of the GPS/RTK position sensor 23 from the TX antennas. At step 410 the GPS/RTK Service 215 determines from the ATS Main Service 220 whether the GPS/RTK position sensor 23 is attached to an object such as a vehicle and if so the GPS/RTK Service 215 associates the GPS/RTK position sensor 23 with that object. At step 412 the object parameters are updated accordingly. Finally at step 414 the GPS/RTK Service 215 sorts and stores the object parameters. At step 416 the GPS/RTK Service 215 determines from the ATS Main Service 220 whether another frequency needs to be tested, and if so, at step 418 the thread initiates another test based on the next frequency.

Figure 12:
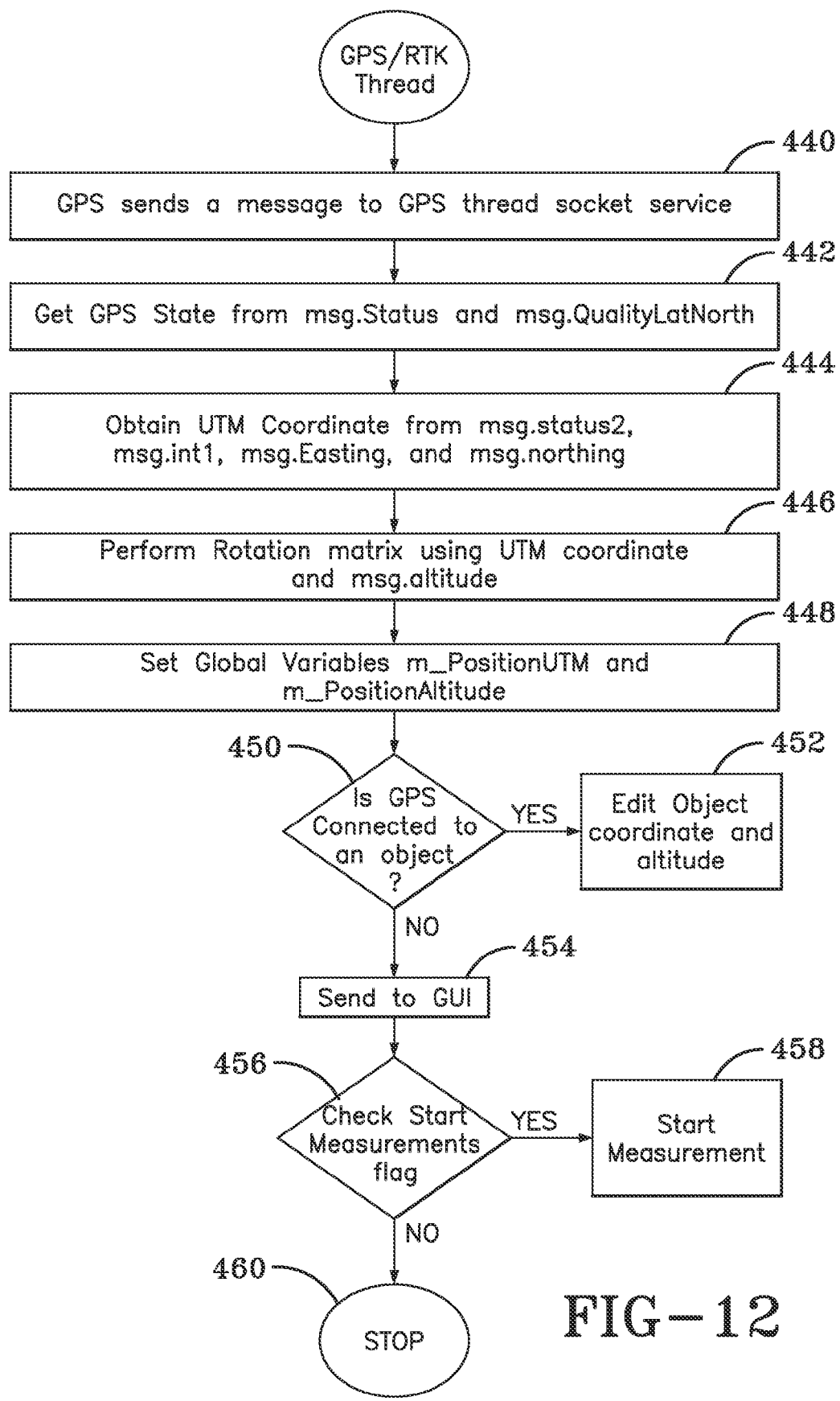
FIG. 12 is a flow chart of a GPS/RTK thread.

FIG. 12 is a flow chart of an exemplary GPS/RTK thread 254. The thread determines if a position sensor is attached to an object, and if so, edits the object parameters to reflect its positional relationship to the sensor. At step 440 the GPS/RTK thread 254 initializes and connects by sending a Message ID to the GPS/RTK Service 215. At steps 442-444 the GPS/RTK thread 254 retrieves the GPS State and UTM Coordinates, and at step 446 it compensates the data. At step 448 global position variables are set up. At step 450 the GPS/RTK thread 254 determines if the position sensor 23 is attached to an object. If so, at step 452 the object parameters are updated with positional and orientational information to reflect the GPS/RTK having been attached. At step 454 the results are sent to the GUI 20, and at step 456 a flag is checked to determine if testing should commence. Based on the binary status of the flag, at step 458 testing begins. Alternatively, the thread stops at 460. FIG. 13 shows listings of exemplary computer code implementing the GPS/RTK thread of FIG. 13 including GPS message structure 472 and INS/NFM message structure 474.

Figure 14:
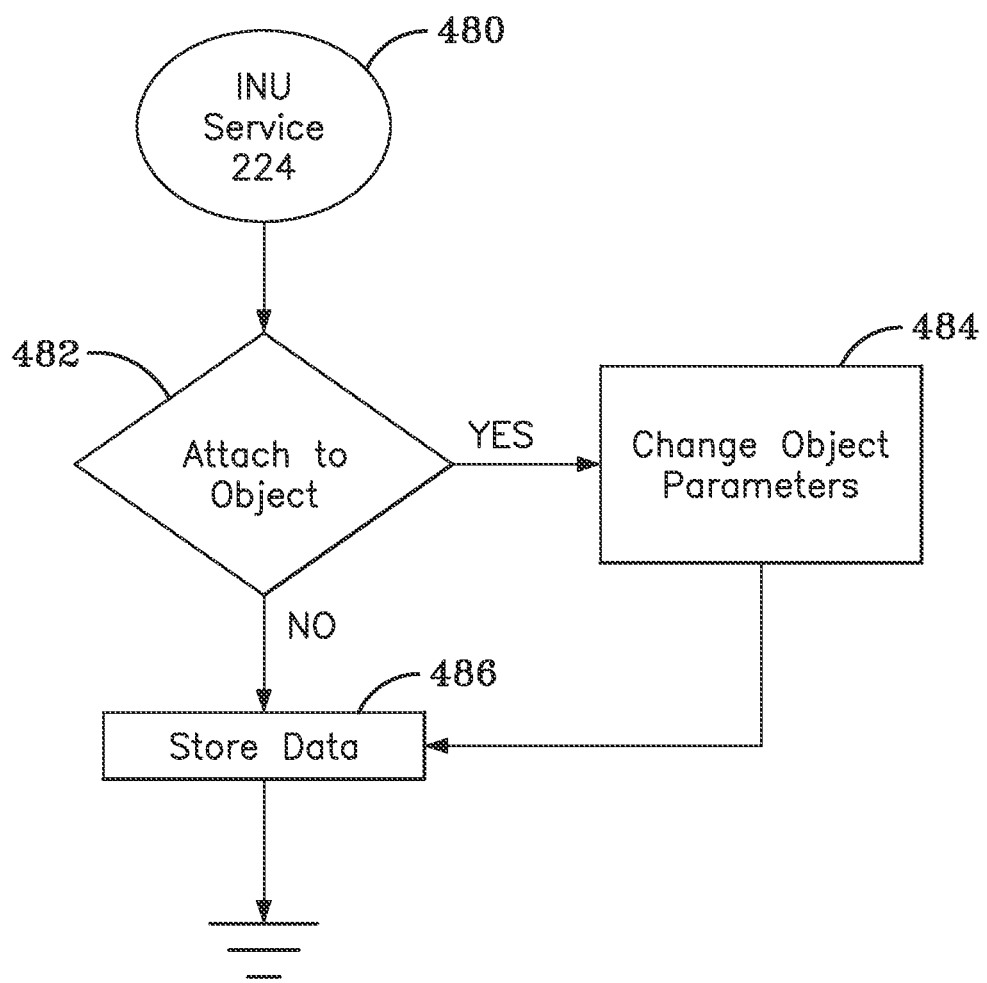
FIG. 14 is a flow chart of an INU Service.

FIG. 14 is a flow chart of the INU Service 224. Similarly to the thread for modifying an object's position, this thread determines if an orientation sensor is attached to the object, and if so, edits object parameters to reflect its orientational relationship to the sensor. At step 480 the INU Service 224 initializes, and in this example at step 482 it determines from the ATS Main Service 220 whether the INU 21 is attached to an object such as a vehicle. If so, at step 484 the INU Service 224 associates the INU 21 with that object and step 484 the object parameters are updated accordingly. Finally at step 486 the INU Service 224 sorts and stores the object parameters.

Figure 15:
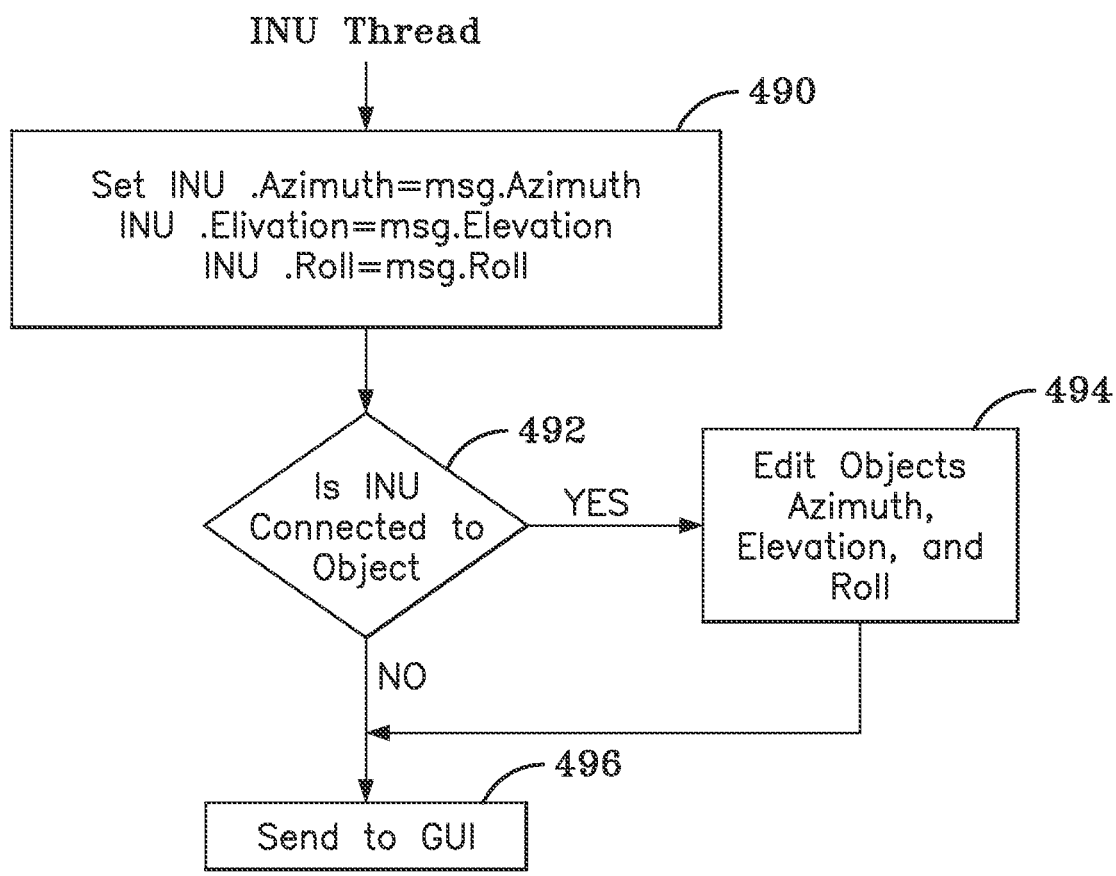
FIG. 15 is a flow chart of an INU thread.

FIG. 15 is a flow chart of an exemplary INU thread 256. At step 490 the thread sets the variables for the INU 21 as follows:

INU.Azimuth=msg.Azimuth
INU.Elevation=msg.Elevation
INU.Roll=msg.Roll

At step 492 the INU thread 256 checks whether the INU 21 is connected to an object. If so, at step 494 the INU thread 256 facilitates editing of the azimuth, elevation, and roll parameters of the object. At 496, the thread sends the parametric data to the GUI 20.

Figure 16:
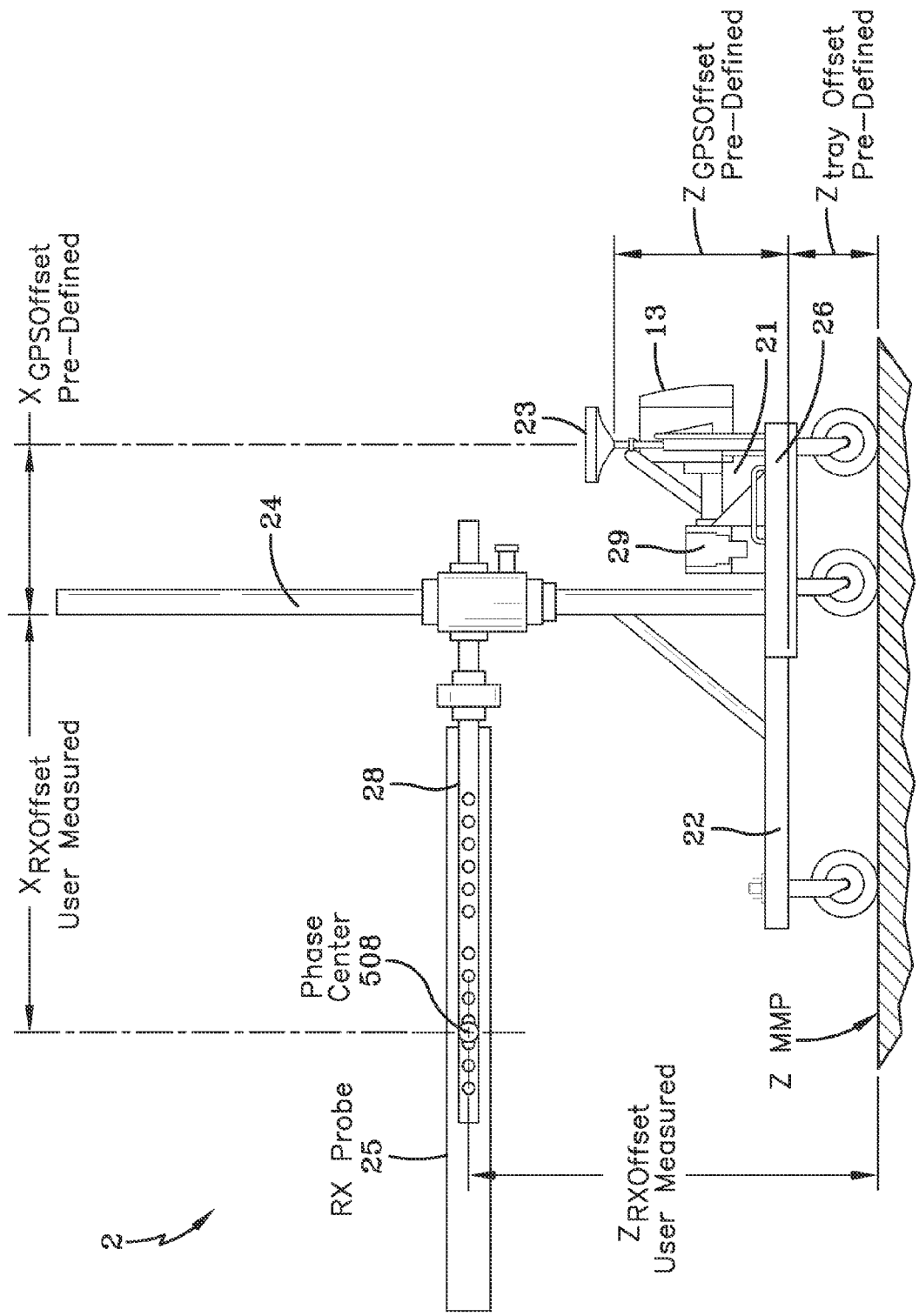
FIGS. 16 and 17 are plan and elevation views of a rover.
Figure 17:
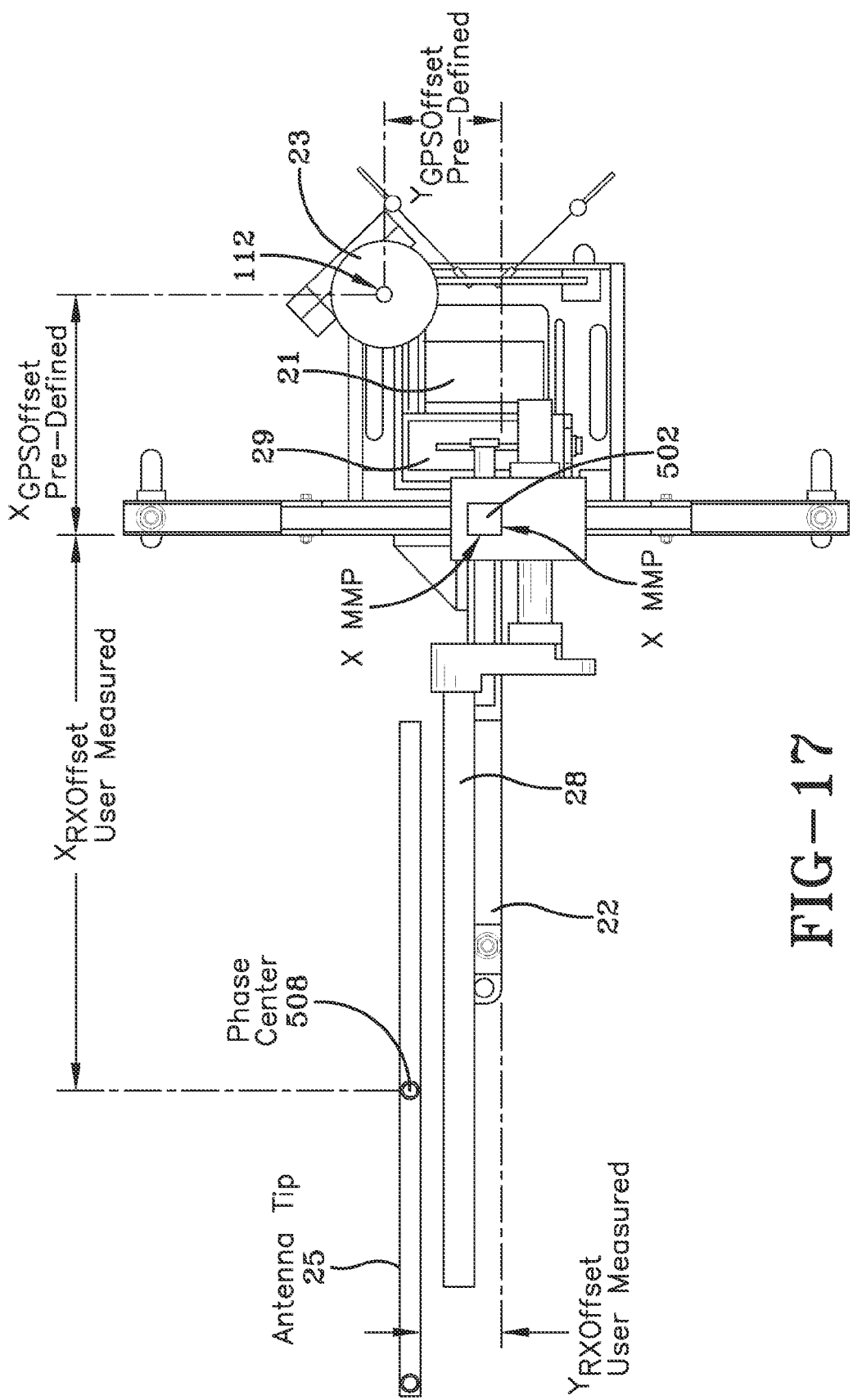
Figure 18:
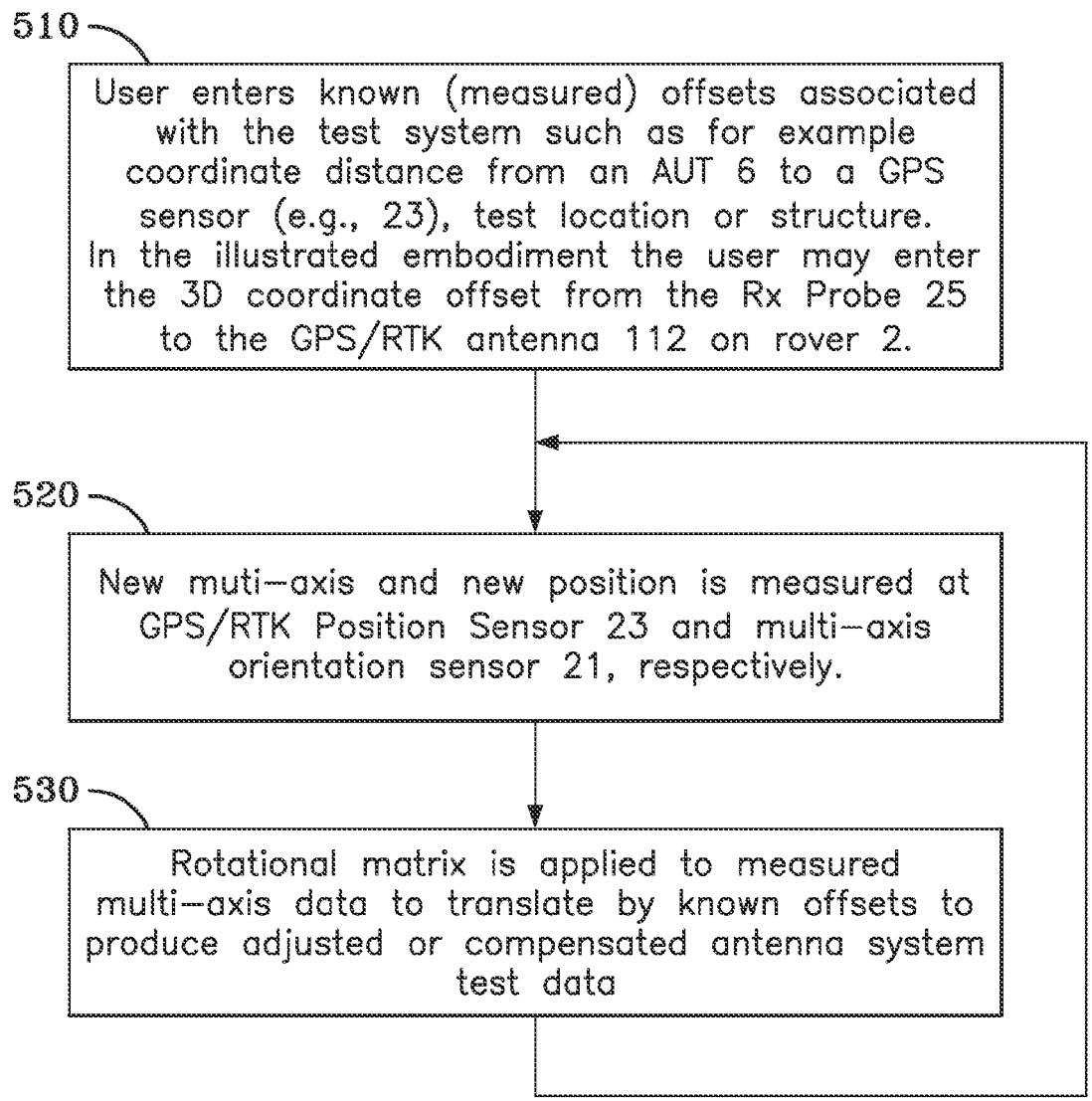
FIG. 18 is a flowchart of a measurement sequence partially executed by the ATS software.

Hereinabove, an ATS system was described including ATS software for establishing connections between hardware components. The disclosure of exemplary embodiments of the invention proceeds below with the description of the hardware offsets and user interfaces for generating and conducting tests. FIGS. 16-17 are detailed plan and elevation views, respectively, of the rover 2. FIG. 18 is a flowchart illustrating an exemplary measurement sequence coordinated by the ATS Main Service 220 where a rotation matrix based on offset dimensions exemplified in FIGS. 16-17 is used to determine an ATS component's actual position based on position and orientation data obtained at a given point of time.

Referring to FIGS. 16-17, the rover 2 generally comprises a portable structure including a platform 22 supporting a non-metallic and/or RF transparent mast 24 and an equipment tray 26 supporting a battery box 29 enclosing batteries for powering all on-board equipment. The mast 24 wields a horizontal extension arm 28 upon which RF probe 25 is mounted. In the present embodiment, the main measurement point (MMP) was designated as MMP 500. In the disclosed embodiment, the mast 24 comprises a rectangular shape 502 (shown in FIG. 17). Two sides of the shape 502 may be selected to facilitate field measurements of axis X and Y of the MMP 500, for example sides X MMP and Y MMP. The Z axis of the MMP 500 is ground.

Referring to FIG. 18, the measurement sequence starts at step 510 when a series of offsets are established including both pre-defined and user-measured (variable) offsets. The pre-defined offsets are measured once during equipment calibration and need only be entered once for multiple test scenarios unless the INU 21 or position sensor 23 are mounted to a different equipment tray 26. By way of example, the pre-defined offsets will herein include $X_{GPSOffset}$, $Y_{GPSOffset}$, $Z_{GPSOffset}$, and $Z_{trayOffset}$.

The user-measured offsets are test-specific measured offsets associated with at least one portion of the test system such as for example coordinates or distance from an antenna under test AUT 6 to a GPS sensor, a test location characteristic or a structure on which a transmitter or receiver antenna (e.g., RF probe 25 or AUT 6) is mounted. These offsets will change between test scenarios. In this example, the user measured offsets will include $X_{RXOffset}$, $Y_{RXOffset}$, $Z_{RXOffset}$, which collectively represent the offsets between the phase center 508 of the AUT 6 and the MMP 500.

The user measured offsets $X_{RXOffset}$, $Y_{RXOffset}$, and $Z_{RXOffset}$ represent the offsets between the phase center 508 of the AUT 6 and the MMP 500. These offsets are measured prior to a specific test scenario and are entered into the ATS software via the GUI 20, wherein the data is captured and stored in a data structure. In this example $X_{RXOffset}$ is measured from the X MMP, $Y_{RXOffset}$ is measured from the Y MMP, $Z_{RXOffset}$ is measured from the ground, and $Z_{trayOffset}$ is measured from the ground.

Offsets may include any measurable parameter which may is necessary to compensate data. The offset data can include item identifier data, reference points, dimension data associated with two or more components in a test system, height data, signal refraction data, signal reflection data or component characteristic data.

The pre-defined offsets $X_{GPSOffset}$, $Y_{GPSOffset}$, $Z_{GPSOffset}$, and $Z_{trayOffset}$ and the user measured offsets $X_{RXOffset}$, $Y_{RXOffset}$, $Z_{RXOffset}$ are used calculate full offsets between the phase center 508 of the AUT 6 and the GPS/RTK antenna 112 as follows:

$$X_{totaloffset} = X_{GPSOffset} + X_{RXOffset}$$

$$Y_{totaloffset} = Y_{GPSOffset} - Y_{RXOffset}$$

$$Z_{totaloffset} = Z_{RXOffset} - Z_{trayOffset} - Z_{GPSOffset}$$

This calculated offset data becomes the basis for determining by mathematical computation using a rotation matrix the coordinate locations of a second section of the test system and the AUT.

At step 520 (during test run mode), new multi-axis and new position data is measured along with RF amplitude (and optionally phase) at discrete test points. The RF data and three dimensional GPS or location data is captured, time-stamped and stored in a data structure. Specifically, orientation data, e.g., azimuth (Az), pitch (P) and roll ($\alpha_o$) is measured by the INU 21. Note that the INU 21 coordinate frame is North, East, Down (NED) while the ATS Software frame is North, East, Up (NEU). Thus, the measured Az must be converted to the NEU frame of reference by 360-Az (measured). Thus, the full offsets $X_{Total\,Offset}$, $Y_{Total\,Offset}$, and $Z_{Total\,Offset}$ are translated using an NEU rotational matrix to obtain compensated offsets $X_{Comp}$, $Y_{Comp}$, $Z_{Comp}$ by rotating the offsets using a rotational matrix, e.g., a known construct that uses an n×n matrix to effect a geometric rotation about a fixed origin in Euclidean space, as shown below:

$$\begin{pmatrix} X_{comp} \\ Y_{comp} \\ Z_{comp} \end{pmatrix} = \begin{pmatrix} X_{TotalOffset} \\ Y_{totalOffset} \\ Z_{TotalOffset} \end{pmatrix} \begin{pmatrix} a_{11} & a_{12} & a_{13} \\ a_{11} & a_{12} & a_{13} \\ a_{11} & a_{12} & a_{13} \end{pmatrix}$$

Next, at step 530, the measured multi-axis data and known offsets are translated by application of the above-described rotational matrix where the measured orientation data, e.g., azimuth (Az), pitch (P) and roll ($\alpha_o$) is measured by INU 21 and is modified in accordance with the compensated offsets $X_{Comp}$, $Y_{Comp}$, $Z_{Comp}$ to produce adjusted or compensated position data $X_C$, $Y_C$, $Z_C$ associated with a selected point, e.g., the phase center of the AUT 6 (or RF probe 25) position. The rotated offsets are applied to the measured GPS/RTK antenna 112 coordinates (for AUT 6 phase center or antenna tip only) to determine the RF probe 25 position (in UTM or MGRS) as follows:

$$X_C = X_{GPS\,Head\,Position} + X_{Comp}$$

$$Y_C = Y_{GPS\,Head\,Position} + Y_{Comp}$$

$$Z_C = Z_{GPS\,Head\,Position} + Z_{Comp}$$

The measurement process may continue in test run mode repeating steps 520-530 using the offset data from step 510 as desired.

The GUI 20 allows a user to compose or define test plans and to select tests. In addition to enabling input of test data, the GUI 20 also enables users to define and implement new test plans, implement old test plans, and open old test plans and view the same. Test data includes parametric profiles of each ATS object, offsets, test patterns (e.g. cylindrical, plane), test points, test sequences, frequencies and frequency bands. Test plan composition involves the organization of the test data to run a test. FIGS. 19-30 illustrate system and test plan configuration and implementation using the GUI 20.

Figure 19:
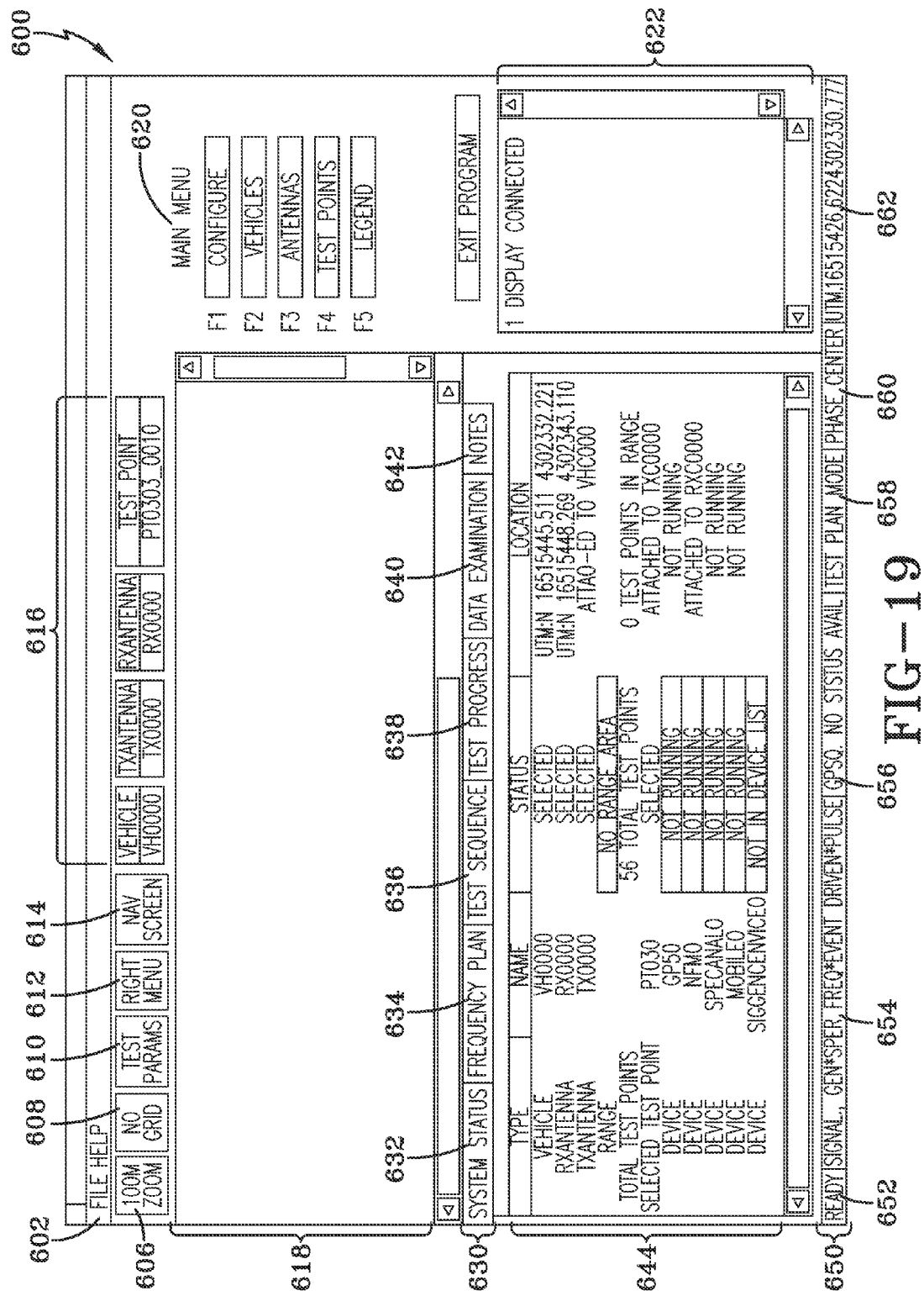
FIG. 19 is an ATS software screen.
Figure 21:
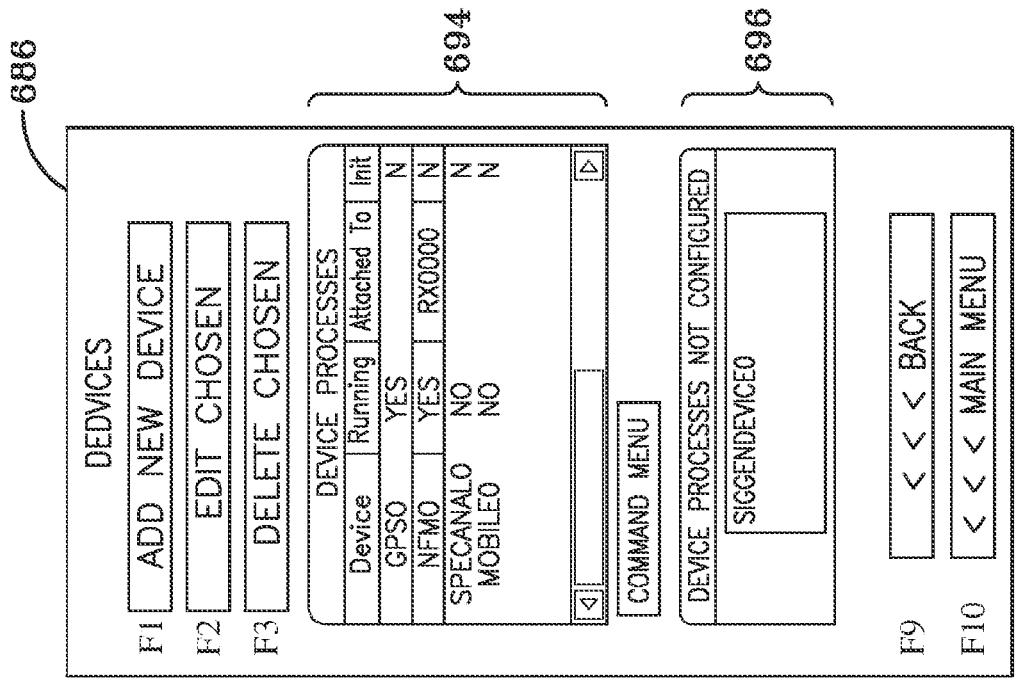
FIGS. 20 and 21 are ATS software configuration screens.
Figure 20:
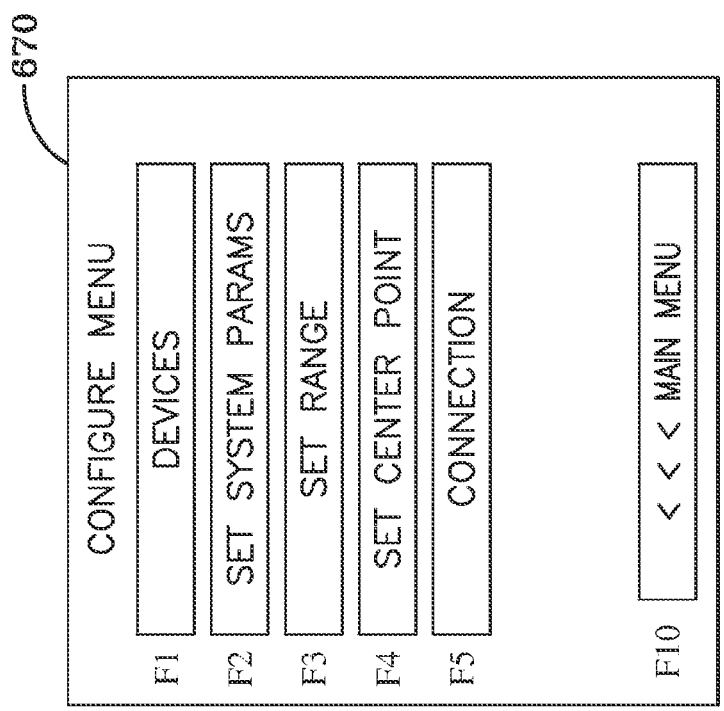

FIG. 19 is a screen shot of an exemplary GUI 20 main screen 600. The screen comprises several components, some of which the user may elect to display or hide. A File Menu 602 is presented horizontally at the top of the screen. To the right are a Main Menu 620 and an Action Log 622. The Action Log 622 displays information, warnings, and errors as they occur during testing including all software Actions processed by ATS Main Service 220. Additional screens associated with the Main Menu 620 are shown in FIGS. 20-21. A Display Menu 604 controls a Display Area 618. A Test Parameters Menu 630 controls a Parameters Display Area 644. Additional screens associated with the Test Parameters Menu 630 and the Parameters Display Area 644 are shown in FIGS. 25, 26, 29A and 29B. A Status Bar 650 shows current system information/status. It includes an ATS Status 652, Test Pattern Generator 52, configuration 654, GPS/RTK signal quality 656, current mode of software 658 (e.g. test plan mode, test run mode, data collection mode), current rotation matrix setting 660 (e.g., RF probe 25, phase center, RF probe 25 tip or GPS head 112), and current position 662 of the rover 2.

The user may compose a new test plan by selecting File/New in the File Menu 602. Other File options include Open, Close, Save Plan as Template, and Exit. Alternatively, the user may choose a previously generated test plan by activating File/Open and selecting by name a previous test plan. File/Close saves and closes the current test plan. File/Save As Template saves the current test plan as a template. File/Exit closes the GUI 20. After opening a test plan, the user can modify it using the Main Menu 620.

The Main Menu 620 allows the user to define the test plan objects and where they are located relative to each other based on a coordinate system. Coordinate systems include the Universal Transverse Mercator (UTM), Military Grid Reference System (MGRS) and Latitude/Longitude. The test plan objects include vehicles, TX antennas, RX antennas, test points, collection points and range lines. A user can access configuration menus to configure a test plan by activating menu buttons or pressing function keys. Function keys F1-F4 activate CONFIGURE, VEHICLES, ANTENNAS, and TEST POINTS menus. The F5/LEGEND button displays icon legends in the test pattern Display Area 618. The F6/EXIT button ends the GUI 20 session.

Each of the Main Menu 620 menus will now be described, including the lower level menus to which they refer, followed by descriptions of the remaining objects in FIG. 19. Referring to FIG. 20, the F1/CONFIGURE Menu 670 function keys/ buttons include F1/DEVICES, F2/SET SYSTEM PARAMS, F3/SET RANGE, F4/SET CENTER POINTS, F5/CONNECTION and F10/MAIN MENU.

FIG. 21 is an exemplary screen shot of the F1/DEVICES Menu 686 of the CONFIGURE Menu 670. The screen includes a F1/ADD NEW DEVICE button, a F2/EDIT CHOSEN button, a F3/DELETE CHOSEN button, a Device Processes List 694, a Device Processes Not Configured List 696, a F9/BACK button and a F10/MAIN MENU button. The F1/ADD NEW DEVICE button activates a menu that allows the user to register a new device process. The F2/EDIT CHOSEN button activates a menu that allows the user to edit a description of the selected device process and to attach, or associate, a sensor with an object displayed in the Display Area 618. The attached object moves in the Display Area 618 as the sensor moves in the field. Objects can be attached or unattached to the device process. The F3/DELETE CHOSEN button allows the user to delete the selected device process. The Device Processes List 694 shows devices registered and running. Any defined device will appear both in the Device Processes List 694 and on the Test Pattern Display Area 618. The user can navigate to the respective device to choose it and activate the F2/EDIT CHOSEN button to edit the device configuration parameters or the F3/DELETE CHOSEN button to delete the device process. Device Processes List 694 also shows if a device is attached to a component. Devices labeled GPS0, NFM0, SPECANAL0, and MOBILE0 are shown. GPS0 is a position sensor and NFM0 is an orientation sensor. NFM0 is attached to an RX antenna. The Device Processes Not Configured List 696 shows the device processes that are currently running but which have not been registered. Any listed process can be selected and then registered by double-clicking it. The F9/BACK button returns the user to Configure Menu 670. The F10/MAIN MENU button returns the user to Main Menu 620.

The F2/SET SYSTEM PARAMS Menu of the CONFIGURE Menu 670 (not shown) activates dialogs including a Position Location, a RX Offsets, a TX Offsets, a Tolerances and a Test Run Params Dialog. The Position Location Dialog allows the user to set the location of the RF probe 25 measurement point which may comprise the GPS head, phase center, probe tip, etc. The RX and TX Offset Dialogs allow the user to input offset parameters such as those described with reference to FIGS. 16-18. The Tolerances Dialog allows the user to preset acceptable testing tolerances for proximity to an object when navigating to it. The Test Run Params Dialog (shown in FIG. 27) allows the user to preset data collection variables.

The F3/SET RANGE menu of the Configure Menu 670 (not shown) allows the user to enter and modify a defined test range area. A test range is a polygon that defines the area that a test is to be performed in. The test range is displayed in the test pattern Display Area 618. A range is optional and any test points that lie outside of a defined range can still be tested. In order to create a test range area, a name and a minimum of three coordinate points must be entered. Alternatively, the RF probe 25 can be pushed to key locations in order to define a test range area, and the coordinate locations will auto-populate. Alternatively, a test range area can be defined graphically simply by clicking selected points on the test pattern Display Area 618.

Figure 22:
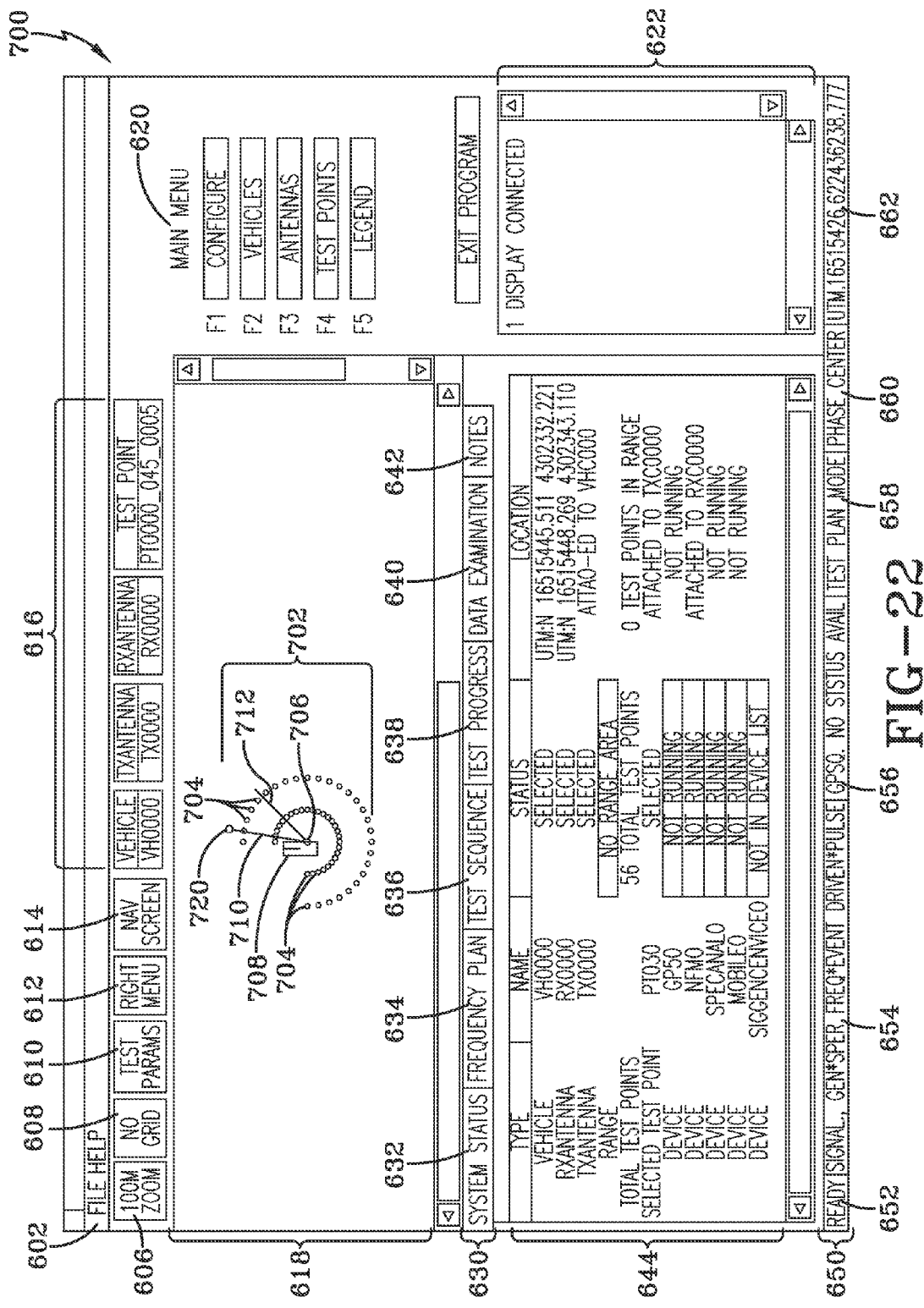
FIGS. 22 and 23 are screen shots of exemplary graphical representations of testing patterns.
Figure 23:
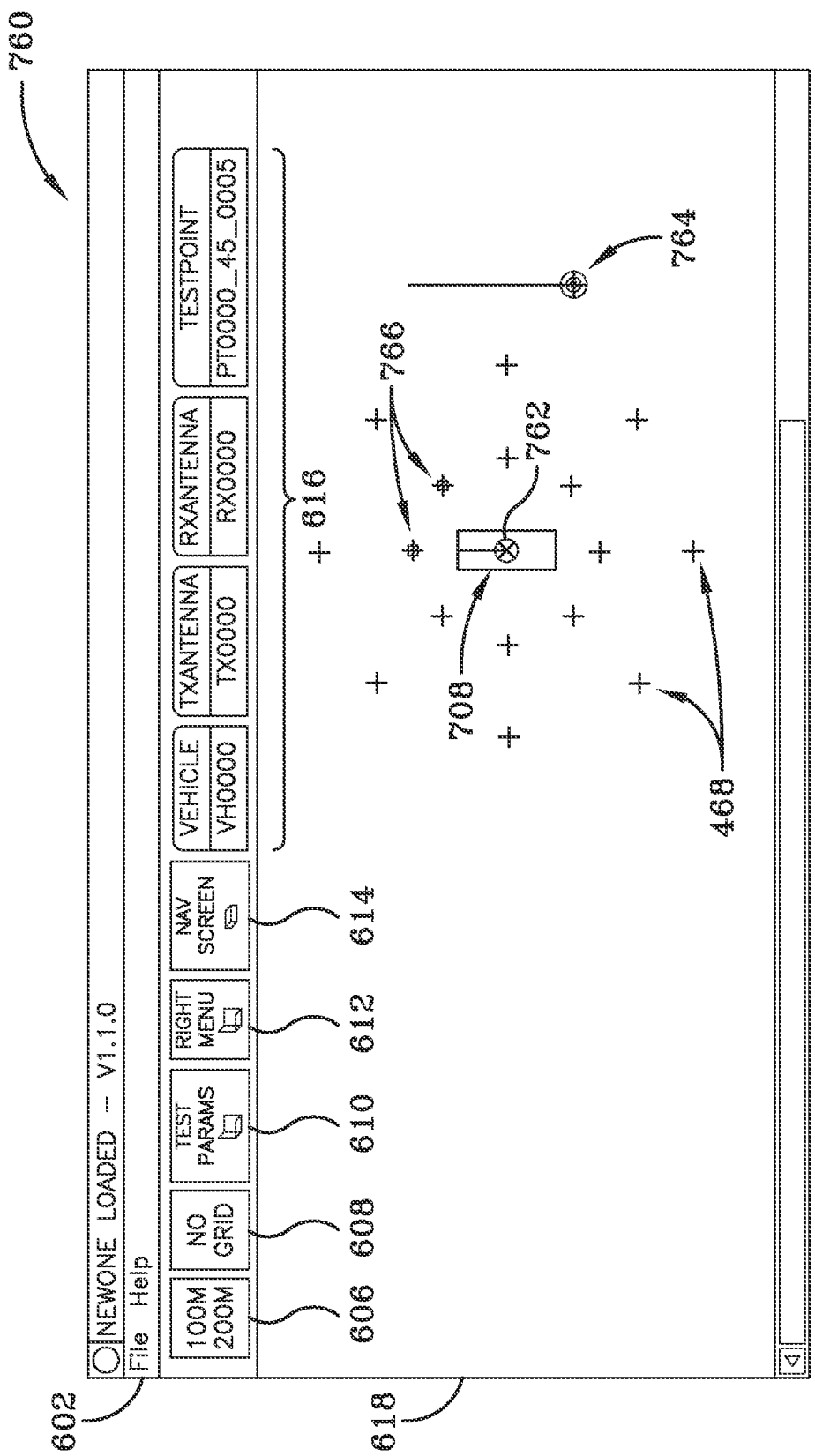

The F4/SET CENTER POINT menu of the Configure Menu 670 (not shown) allows selection of the center point of a test pattern in Display Area 618. Exemplary center points are shown in FIGS. 22-23.

The F5/CONNECTION menu of the Configure Menu 670 (not shown) allows connection or disconnection of various ATS components to the ATS Main Service 220. To connect, an IP address is entered and a TCP connection is attempted with the ATS Main Service 220. After an IP address has been entered once, the ATS Main Service 220 will attempt to connect on start up. If a connection cannot be made the user may change the IP Address of the ATS Main Service 220.

Continuing with the description of the Main Menu 620 objects shown in FIG. 19, the user can activate VEHICLE, ANTENNAS and TEST POINT menus to configure the system. The F2/VEHICLES menu includes a Choose Vehicle List (not shown) containing predefined vehicles existing in the database. Each vehicle record may contain fields for storing vehicle information including name, nomenclature, description, length, width, height, and location. Certain parameters are static for a particular vehicle such as height, length, and width, while other parameters, such as location, can change. The user can add a new vehicle by entering its data, edit parameters of pre-existing vehicles, or delete a vehicle from the database. In addition, any defined vehicle can have other defined objects attached to it. For example, a vehicle may be chosen from the Choose Vehicle List, have a TX Antenna attached to it, and in turn, the TX Antenna may have a plurality of test points attached to it.

The F3/ANTENNAS menu of Main Menu 620 (not shown) allows a sub-selection of TX and/or RX Antennas. For TX Antennas, the user is presented with a Choose Antenna List containing TX Antennas that are pre-defined in the database. Each antenna record may contain fields for storing antenna information including name, nomenclature, description, height, type (vehicle mounted or standalone), X (if vehicle mounted, then X meters from the middle of vehicle facing north), Y (if vehicle mounted, then Y meters from the middle of vehicle facing north), vehicle (if vehicle mounted, then vehicle name), and coordinate (if standalone). A TX Antenna can be mounted to a vehicle, or as a standalone TX Antenna. Once the data is entered, the TX Antenna will be added to the database. Alternatively, the coordinate data can be obtained graphically from the Display Area 618 in a point-and-click manner, or quantitatively using the test equipment as described above and by moving the RF probe 25 to the location where the RX Antenna will reside and obtaining the coordinate point from the position sensor 23. The RX Antennas Menu is similar and parameters may be entered as previously described. Each RX antenna record may contain fields for storing antenna information including name, nomenclature, description, coordinate and height. Given defined TX and RX antennas as per above, the user can define test points for testing those antennas.

The F4/TEST POINTS menu of Main Menu 620 (not shown) enables users to add and define test plan test points. Each test point record may include fields such as name (in the following format: PTXXXX_YYY_ZZZZ where XXXX=the TX antenna that the test point is attached to, e.g., AUT 6, YYY=the azimuth of the test point from the TX antenna, and ZZZZ=the distance from the TX antenna), type (attached to vehicle or standalone), TX Antenna, distance and azimuth. Test point parameters also include radius/angle between test points, distance from AUT 6 center, etc. Test points may be added individually or collectively. A plurality of test points can be added collectively by a radial method in which a starting angle, an ending angle, a starting distance, an ending distance, and the distance between them is defined. Also, test points can be added manually from a test pattern displayed in Display Area 618 by centering the mouse pointer somewhere in the test pattern and clicking an input device (mouse) to cause the test point coordinates to auto-populate. Test points can also be added using the test equipment, for instance by placing RF probe 25 at the test point location and obtaining the test point coordinates from the position sensor 23.

A user can also define specific test bands for each test point to establish bands of frequencies that can be used during testing. Test bands record fields include band name, description, number of frequencies, low freq (MHz) and high freq (MHz). An Add New Frequency Band Dialog facilitates the foregoing. Similarly, a user can define specific test sequences to create the sequence of steps (Actions) pursuant to which the test plan will collect the necessary data. Actions can be used to define the testing order including test point, test point parameters, sample numbers etc.

The remaining objects displayed in FIG. 19 will now be described. The Display Menu 604 includes a plurality of display objects. A Zoom Button 606 resizes display of test data on the Display Area 618. The data may be zoomed between 1000 m, 500 m, 100 m, and 10 m. A Grid Button 608 selects/deselects display of a grid on the Display Area 618. The Test Params Button 610 selects/deselects display of the Test Parameters Menu 630 and the Parameters Display Area 644. The Right Menu Button 612 selects/deselects display of the Main Menu 620. The NAV Screen Button 614 displays a navigation screen for use with PDA 27 and described in more detail with reference to FIG. 30. The Test Indicator Area 616 identifies the current vehicle, TX and RX antenna and test point. The Display Area 618 displays test patterns, objects attached to devices and other test parameters.

FIG. 22 is a screen shot of a screen display 700 showing an exemplary test pattern 702. The test pattern 702 includes test points 704 disposed in two radial patterns centered on a point 706 representing a center point of the AUT 6 which is mounted on a vehicle represented by the vehicle graphic 708. The test points 704 were selected by choosing radius/angle parameters between test points and distance from the AUT 6 center. The test pattern also includes an azimuth line 710 of RF probe 25 and an azimuth line 712 of AUT 6. An icon 720 represents the position of a rover 2 and an RF probe 25.

FIG. 23 is a screen shot of a screen display 760 showing another exemplary test pattern. The test pattern includes the vehicle graphic 708, a center point 762 and an icon 764 representing the position of RF probe 25. The test pattern in this embodiment shows test points 766, or sites, included in the test plan and test points 768 not included in the test plan. The included points 766 and not included points 768 are radially disposed around center point 762.

Finalizing the description of the main screen 600 (shown in FIG. 19), the Test Parameters Menu 630 includes a plurality of tabs that allow user-selection of information about the status and progress of the current test. The tabs may be used to execute the method described below with reference to FIG. 24. The tabs include System Status Tab 632, Frequency Plan Tab 634, Test Sequence Tab 636, Test Progress Tab 638, Data Examination Tab 640 and Notes Tab 642. The System Status Tab 632 enables viewing of configuration information including object type (what the items of the test are), name (the name chosen for the item), status (the current status of the item), and location (the coordinates of the item or what it is attached to). The Frequency Plan Tab 634 enables creation of test frequency plans. The Test Sequence Tab 636 enables creation of testing sequences. The Test Progress Tab 638 enables data collection. The Data Examination Tab 640 enables examination of the collected data. The Notes Tab 642 allows entry of notes at any time in order to aid analysis. The Parameters Display Area 644 displays parameters corresponding to the selected tab. System Status parameters are shown.

Figure 24:
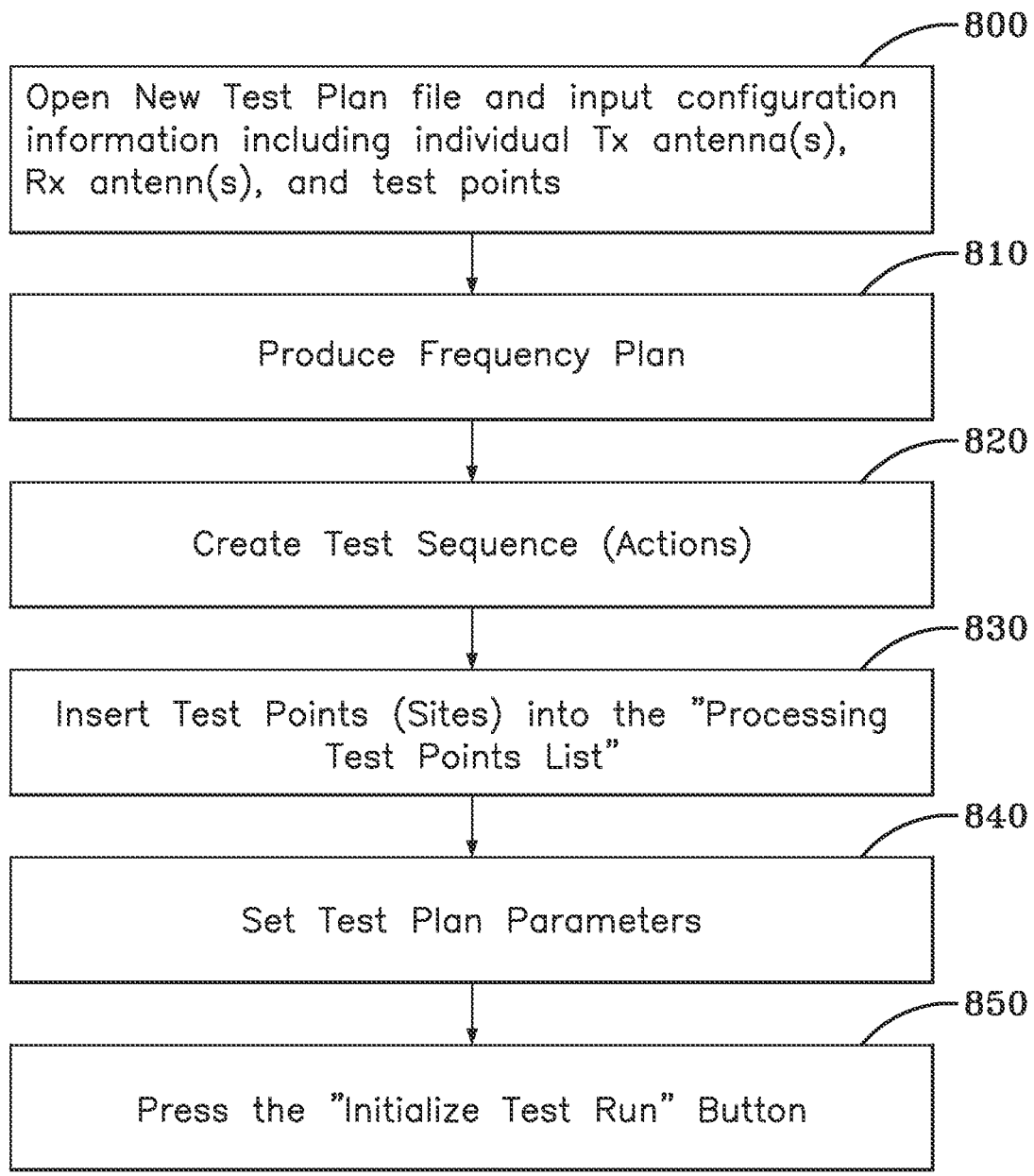
FIG. 24 is a block diagram of a method to create and execute a test plan with the ATS software.
Figure 25:
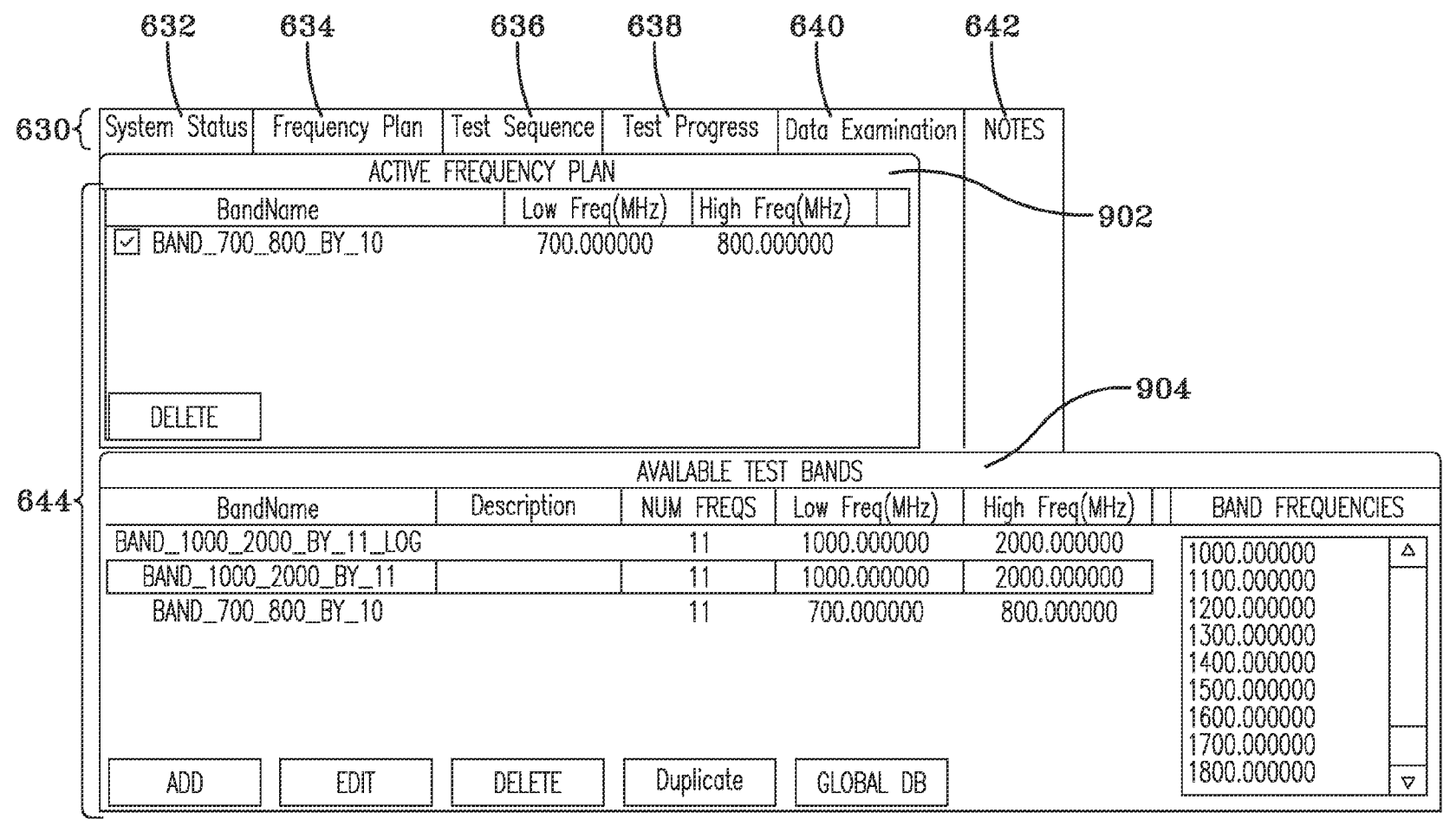

FIG. 24 is a block diagram of a method for creating and executing an exemplary new test plan. The method starts at step 800 when the user opens a new test plan file and defines parametric profiles for the TX and RX antennas, test points and other ATS objects. Then, at step 810 the user inputs a frequency plan comprising bands of frequencies to be tested. An exemplary Frequency Plan Tab 634 for setting a frequency plan is shown in FIG. 25. At step 820 the user creates a test sequence. An exemplary Test Sequence Tab 636 for setting a test sequence is shown in FIG. 26. At step 830 the user inserts test points into the test plan. At step 840 the user sets test plan parameters including data acquisition parameters related to test points. The Test Params button 610 may be selected to initiate a dialog such as that shown in FIG. 27 which allows the user to specify data collection variables. Once the system and test plan are defined, at step 850 the user can press an "Initialize Test Run" button to enter a measurement mode in which the test plan is implemented.

FIG. 25 is a screen shot of the Frequency Plan Tab 634 showing an Active Frequency Plan List 902 and an Available Test Bands List 904. The Available Test Bands List 904 is a storage place for defined frequency bands. Using the Add, Edit, and Delete buttons at bottom a user can define frequency bands available for testing and can select bands for use with a test plan. Selected bands are shown in the Active Frequency Plan List 902.

FIG. 26 is a screen shot of the Test Sequence Tab 636 showing a Test Sequence List 910 and a Processing Test Pts List 912. The Test Sequence List 910 sets the order in which testing will proceed. It is a tree list in which parent items set parameters for all test points through one sweep of the test pattern and child items set parameters for specific test points. A test pattern is a relationship between test points which may be calculated by the ATS software or may be input by an operator. In one embodiment, the ATS software determines the pattern based on the most efficient movement of the rover 2 to complete the test. In another embodiment, the operator may establish the order of the test points. For example, the operator may establish a pattern with selected test points and subsequently perform another test by adding additional test points. The addition may be performed by adding, editing or deleting Actions. In a third embodiment, the pattern follows the contour of a virtual shape, for instance a cylindrical shape centered on the AUT 6, regardless of whether contouring is the most expeditious way of performing the test. The virtual shape may be inputted during the configuration phase of the test or in selectable templates corresponding to AUT types. A "Pass Change" is a parent action. A "TP Change" is a child of a "Pass Change" action and will be performed while at the test point under test before moving to the next test point in the pattern. In the example shown, parent item X THRU 1 has a child item of CHANGE 1.1. The Processing Test Pts List 912 shows test points in the test plan. Thus, testing will performed in the following order: (1) go to the first test point, (2) set parameters according to X THRU 1, (3) collect data, (4) set parameters for Change 1.1. (change RX Polarization from Horizontal to Vertical), (5) collect data, (6) go to the next test point, repeat steps 2-6 until testing is completed.

FIG. 27 is a screen shot of an exemplary Test Run Params Dialog 920. TEST RUN SYNC refers to synchronization of the test which can either be GPS (position) driven or Event driven. GPS driven means that data is collected at the frequency of the GPS. Event driven means that data is collected after a data point is received and a new request is sent. # POINTS PER FREQ determines the number of collected data points recorded for each frequency during the Data Collect Mode. SIGNAL SOURCES can be a signal generator or a TX system. DATA CALCULATION METHOD can either be Average or Peak Hold. This value is sent to the test pattern analyzer 96 at the time of data collection. FLOOR PARAMETERS include the number of samples and number of data points per sample. These values are also sent to the test pattern analyzer 96 at the time of data collection. ADD TO PREVIOUS TEST RUN adds the test results to a previous test run which can be loaded while in the Test Plan Mode.

Figure 28:
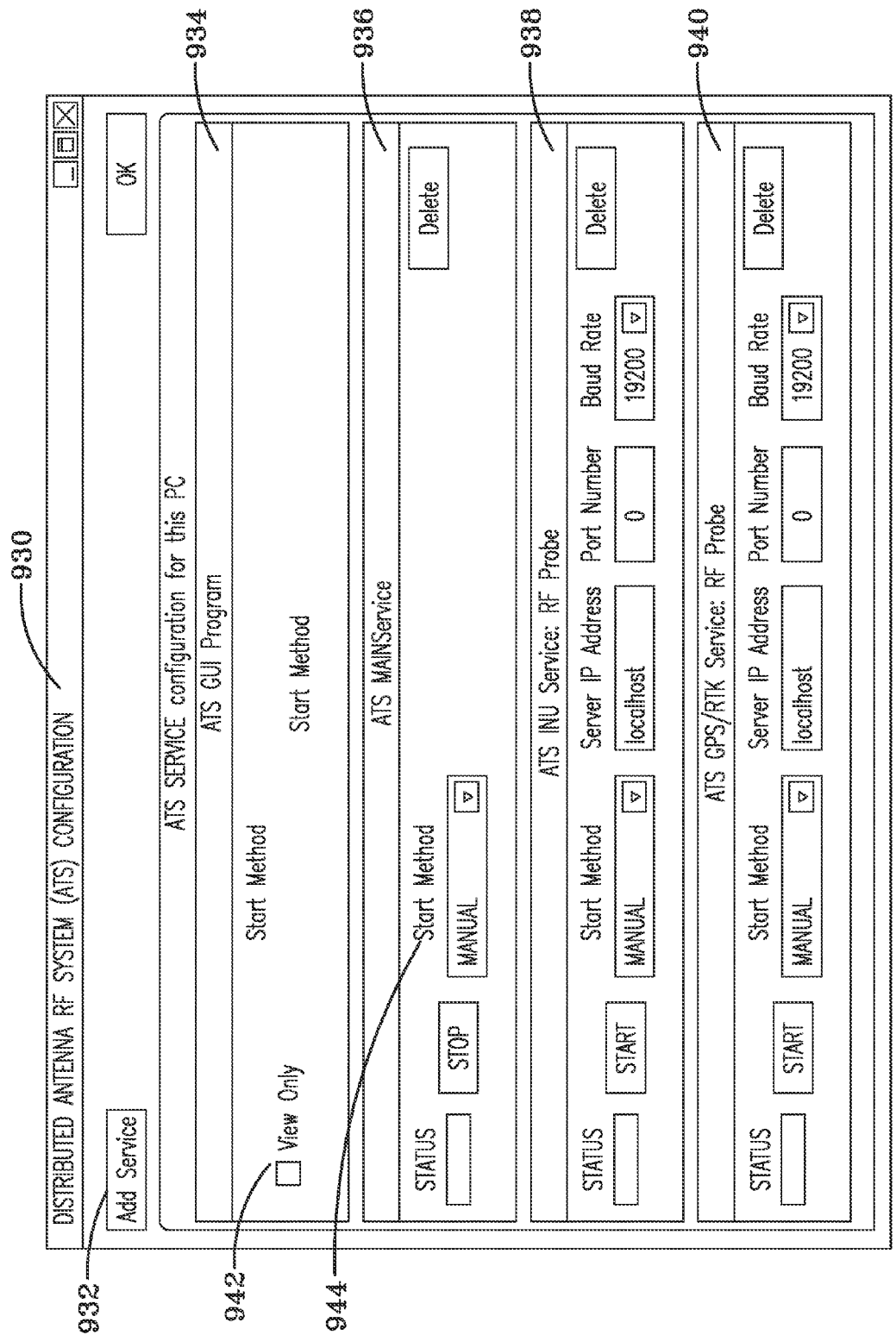
FIG. 28 is a screen shot of a Test System Dialog.
Figure 29:
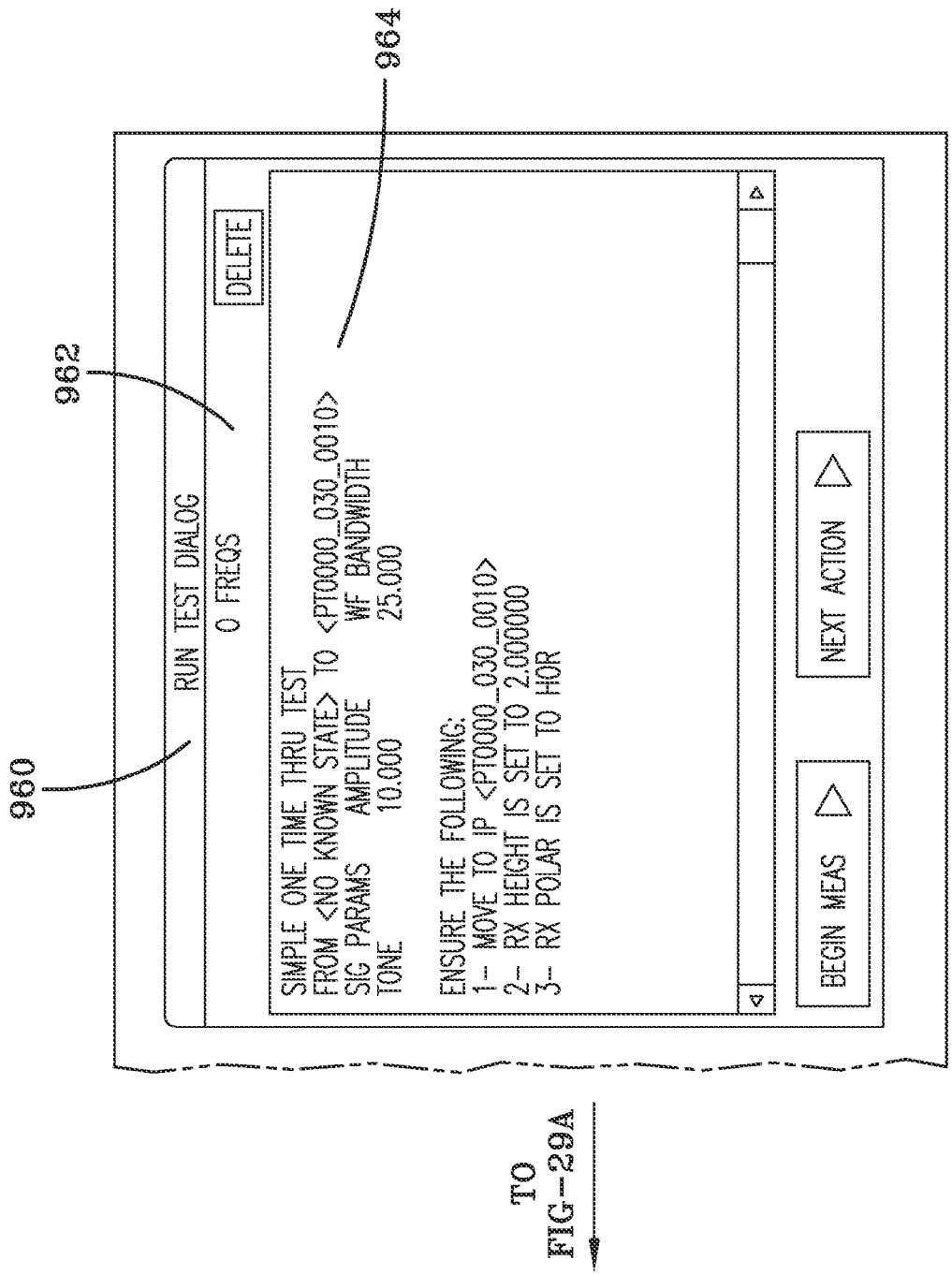
FIGS. 29A and 29B are a screen shot of a Test Progress Tab.

FIG. 28 is a screen shot of an exemplary embodiment of an ATS configuration screen 930. Services can be added by activating the Add Service button 932, which initiates an Add Process Dialog (not shown) that allows the user to select a service from a list. Upon selection, the service is assigned an instance number and shown on this screen. Service boxes 934, 936, 938 and 940 show an ATS GUI Program, ATS Main Service 220, INU Service 224 and GPS/RTK Service 215 which were added after clicking the Add Service button 932 four times. More services can be added by this process. The View Only checkbox 942 allows a PC to connect to the ATS Main Service 220 to read/access a test in progress for a test being controlled by another RXB 9. A service box may show objects and parameters including a status Indicator (green if running, else red), a START/STOP button and a Start Method list 944 where the service must be started and stopped by the user if set to Manual and the service will be started when the computer is turned on if set to Automatic. Communication objects and parameters presented in service boxes may include a Server IP Address edit, Port Number edit and Baud Rate list (this list is insensitive because the values are preset).

Services can be started and stopped at any time. When started, a service automatically connects to the ATS Main Service 220. If the ATS Main Service 220 is stopped, the other services' connection status indicators turn red. When the ATS Main Service 220 is restarted, the other services will reconnect automatically.

FIGS. 29A and 29B are a screen shot of the Test Progress Tab 638 showing a Test Progress List 950 and a Run Test Dialog 960. The Test Progress List 950 contains the test plan Actions. Actions can be set-up actions and actions relating to test points. The first two Actions shown are to collect RX and TX cable calibration data. The subsequent Actions shown correspond to test points. When an Action is selected in the Test Progress List 950, the test point associated with the Action becomes the selected test point. In the Test Run Mode, a RUN TEST Dialog 960 is shown. Controls on the RUN TEST Dialog 960 allow the user to collect data and show status of that collection process. The RUN TEST Dialog 960 displays instructions to the user to be performed before data collection is to be started. The user performs a required instruction and presses a NEXT ACTION button to select the next Action in the Test Progress List 950. Testing enters Measurement Mode when the BEGIN MEAS Button has been pressed. The top Dialog window 962, showing 0 FREQS, displays the number of collected frequency points at the last test point of the Action selected from the Test Progress List 950. A DELETE Button deletes the last test point of the selected Action from the Test Progress List 950. This is to allow the user to delete data that the user knows to be bad data. A Text List 964 contains information related to the selected test point. The information includes a description of the Action, a description of a relation from the last test point to the current test point, signal parameters, amplitude and waveform bandwidth of the Action. Text may be color-coded. Red text details steps to be performed before entering into the Measurement Mode for the Action. The information may also include frequency, floor, and amplitude values of collected frequency points.

While in the Test Run Mode, the user can switch to the Data Examination Tab 640 to view almost all of the data recorded that is associated with the test run. In the disclosed embodiment, the test must be paused to display data in the Data Examination Tab 640. The data will be displayed in three embedded tables that allow the user to drill down to attain higher levels of detail. The tables are arranged in the following tree format:

A. Top Level Test Action Data

| Col | Information |
|---|---|
| 1 | Test Point |
| 2 | Action # |
| 3 | Description |
| 4 | # Of Collection Points |
| 5 | Rx Height |
| 6 | Rx Polarization |
| 7 | Waveform |
| 8 | Amplitude |
| 9 | Waveform Bandwidth |
| 10 | Rx Antenna Text |
| 11 | Tx Antenna Text |
| 12 | Vehicle Text |
| 13 | Custom Text |

B. Middle Level Collection Point Data

| Col | Information |
|---|---|
| 1 | Collection Point # |
| 2 | Was Coordinate Obtained From The Gps? |
| 3 | Utm - The Coordinate |
| 4 | # Of Data Points |

C. Bottom Level Data Point Data

| Col | Information |
|---|---|
| 1 | Data Point # |
| 3 | Frequency |
| 5 | Amplitude |
| 6 | Results Amplitude |
| 7 | Floor |
| 8 | Noise Floor |
| 9 | Wait ms |
| 10 | # Of Samples |
| 11 | # Of Data Points Per Sample |
| 12 | Time Before Send To Specan |
| 13 | Time After Rcv From Specan |
| 14 | Rx Gps Coord Before Send |
| 15 | Rx Gps Coord After Rcv |
| 16 | Rx Azimuth |
| 17 | Rx Roll |
| 18 | Rx Elevation |
| 19 | Rx Altitude |
| 20 | Rx Height |
| 21 | Tx Gps Coord Before Send |
| 22 | Tx Gps Coord After Rcv |
| 23 | Tx Azimuth |
| 24 | Tx Roll |
| 25 | Tx Elevation |
| 26 | Tx Altitude |
| 27 | Tx Height |

Figure 30:
FIG. 30 is a screen shot of a Navigation Dialog.

FIG. 30 is a screen shot of the Navigation Dialog. During Measurement Mode, the ATS Software compiles the Navigation Dialog that is output to the PDA 27 to provide the user information as to how to move the RF probe 25 to each successive test point. The Navigation Dialog puts the selected item (usually the RF probe 25) at the center of a display screen with all items relative to the selected item, including the name and current coordinates of the item that is to be navigated, the name and current coordinates of the item that is to be navigated to (usually the test points), the true distance between the two selected items in the east-west direction, the true distance between the two selected items in the north/south direction, the angular deflection between the objects, and the scale of the display. This from-to dialog with visual cues guides the user in moving the RF probe 25 to each successive test point during testing.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A method for controlling a plurality of equipment items to perform spatial pattern analysis, comprising the steps of:
   providing a plurality of equipment items comprising a processor, an input/output (I/O) system, a data storage medium comprising a random access memory and another storage system, a multi-axis sensor configured to determine three-axis orientations, a global positioning system (GPS), a real time kinematics (RTK)/GPS system, a display, and a radio frequency (RF) transmitter/receive station configured to receive, transmit and measure RF signals;
   inputting configuration data pertinent to a test into a database stored on said data storage medium using said I/O system, said configuration data including,
      a parametric profile of each object involved in said test comprising a transmitting object and a receiving probe coupled to at least some said equipment items, and
      dimensional offsets of said transmitting object relative to said receiving probe, wherein said offsets define dimensional relationships between GPS, RTK/GPS, and multi-axis sensors and the transmitting and receiving objects such that when the receiving and/or transmitting objects are moved during testing, the dimensional offsets enable precise re-calculation of an actual positional and orientational relationship between the objects based on newly acquired sensor data,
   defining a test plan and storing said test plan in said data storage medium using said I/O system including a plurality of test points of said transmitting object relative to said receiving probe and a test sequence for controlling at least some equipment items for measurements at said test points;
   moving a movable object coupled to one of said transmitting object and said receiving probe between said test points;
   implementing said test plan by operating at least some said equipment items for measuring test data, a position of said movable object and an orientation of said movable object at each test point;
   determining from said measured position and orientation by operating at least some said equipment items a coordinate location of said one of said transmitting object and said receiving probe and storing determined results on said data storage medium;
   storing said measured test data and said coordinate location on said data storage medium; and
   displaying a graphical user interface on said display including a graphical representation of said transmitting object, said receiving probe, said test points, and progress of said measuring.

2. The method for controlling a plurality of equipment items to perform spatial pattern analysis according to claim 1, wherein said step of determining from said measured position and orientation a coordinate location further comprises operating at least some said equipment items and translating said measured position and orientation into an exact coordinate location using a rotational matrix and storing determined results on said data storage medium.

3. The method for controlling a plurality of equipment items to perform spatial pattern analysis according to claim 1, wherein said step of measuring a position of said movable object further comprises operating at least some said equipment items and measuring a GPS position of said movable object.

4. The method for controlling a plurality of equipment items to perform spatial pattern analysis according to claim 3, wherein said step of measuring a GPS position of said movable object further comprises operating at least some of said equipment items and measuring an RTK/GPS position of said movable object and storing measured result on said data storage medium.

5. The method for controlling a plurality of equipment items to perform spatial pattern analysis according to claim 1, wherein said step of measuring an orientation of said movable object further comprises operating at least some of said equipment items and measuring azimuth, pitch, and roll of said movable object and storing measured result on said data storage medium.

6. The method for controlling a plurality of equipment items to perform spatial pattern analysis according to claim 5, wherein said step of measuring azimuth, pitch, and roll of said movable object is accomplished with said multi-axis sensor that is an inertial navigation unit.

7. The method for controlling a plurality of equipment items to perform spatial pattern analysis according to claim 1, wherein said test data comprises RF amplitude data.

8. The method for controlling a plurality of equipment items to perform spatial pattern analysis according to claim 7, wherein said test data comprises RF phase data.

9. The method for controlling a plurality of equipment items to perform spatial pattern analysis according to claim 7, wherein said step of measuring RF amplitude data further comprises operating at least some said equipment items and time-stamping said test data.

10. The method for controlling a plurality of equipment items to perform spatial pattern analysis according to claim 1, wherein said step of moving said movable object further comprises operating at least some said equipment items and providing a graphical user interface on said display to guide an operator to move said movable object between said test points.

11. The method for controlling a plurality of equipment items to perform spatial pattern analysis according to claim 10, wherein said step of moving said movable object further comprises operating at least some said equipment items and displaying in said graphical user interface directional information on said display to guide said operator to move said movable object from a first test point location to a second test point location, wherein said first and second test point locations are based on said test sequence.

12. The method for controlling a plurality of equipment items to perform spatial pattern analysis according to claim 1, wherein said step of moving said movable object further comprises providing a next test point location to a mechanical device adapted to move said movable object from a present location to said next test point location, wherein said next test point location is based on said test sequence.

13. The method for controlling a plurality of equipment items to perform spatial pattern analysis according to claim 1, wherein said objects involved in said test include one or more of said transmitting object, said receiving probe, said movable object, said GPS sensor for measuring said GPS position of said movable object, and said multi-axis sensor comprising an inertial navigation unit.

14. The method for controlling a plurality of equipment items to perform spatial pattern analysis according to claim 1, wherein the step of defining a test plan including a plurality of test points comprises inputting a pattern into the database using said I/O system and operating at least some said equipment items and computing locations of said test points based on said pattern.

15. The method for controlling a plurality of equipment items to perform spatial pattern analysis according to claim 14, further including inputting a number of test points using said I/O system, wherein said operating at least some said equipment items and computing of said locations is based on said number of test points.

16. The method for controlling a plurality of equipment items to perform spatial pattern analysis according to claim 14, further including inputting a distance between test points using said I/O system, wherein said computing of said locations is based on said distance between said test points along said pattern.

17. The method for controlling a plurality of equipment items to perform spatial pattern analysis according to claim 1, wherein the step of defining a test plan including a plurality of test points comprises positioning said movable object at a location, operating at least some equipment items and measuring a position and an orientation of said movable object at said location, and adding a test point to said test plan corresponding to said position and orientation measurements using said I/O system.

18. The method for controlling a plurality of equipment items to perform spatial pattern analysis according to claim 1, wherein the step of defining a test plan including a plurality of test points comprises inputting radial parameters using said I/O system including a starting angle, an ending angle, a starting distance and an ending distance from a center of said transmitting object, and a distance between test points, and operating at least some said equipment items and computing said test points based on said radial parameters.

19. A recording medium operable for storing non-transitory machine readable instructions software for spatial pattern analysis, comprising:

a non-transitory machine readable medium operable to store a plurality of non-transitory machine readable instructions configured to be read and executed by a computer processor, said instructions comprising a first, second, third, fourth, fifth, and sixth plurality of non-transitory machine instructions;

wherein said first plurality of non-transitory machine instructions comprises instructions configured to create and store in a computer memory coupled to said computer processor database including a plurality of data structures stored in said computer memory comprising a predefined objects data structure, a parametric profile data structure of each said object, a data structure storing dimensional offsets of said objects stored in said computer memory, a plurality of test points data structures, and a test sequence for measurement at said test points stored in a test sequence data structure configured to operate a plurality of equipment items used in said spatial pattern analysis and controlled by said computer processor, said equipment items comprise a multi-axis sensor configured to determine three-axis orientations, a global positioning system (GPS), a real time kinematics (RTK)/GPS system, a display, and a radio frequency (RF) transmitter/receive station configured to receive, transmit and measure RF signals, said objects including a transmitting object and a receiving probe coupled to said RF transmitter/receive station, wherein said dimensional offsets data comprise a first position relationship from said transmitting object to said RTK/GPS, a second position relationship from said transmitting object to said multi-axis sensor, a third position relationship from said transmitting object to said GPS system, a fourth position relationship from said receiving probe to said RTK/GPS, a fifth position relationship from said receiving probe to said multi-axis sensor, and a sixth position relationship from said receiving object to said GPS system, wherein said offsets define dimensional relationships between GPS, RTK/GPS, and multi-axis sensors and the transmitting and receiving objects such that when the receiving and/or transmitting objects are moved during testing, the dimensional offsets enable precise re-calculation of an actual positional and orientational relationship between the objects based on newly acquired sensor data, wherein said computer memory comprises a random access memory (RAM) and another data storage system;

wherein said second plurality of non-transitory machine instructions comprises instructions configured to load into said processor and execute a software module configured for calculating and executing a test plan based on said database including said test sequence configured to operate at least some of said equipment items and storing said test plan into a test plan data structure in said computer memory;

wherein said third plurality of non-transitory machine instructions comprises instructions configured to load onto said processor and execute software for generating a graphical user interface comprising a geo-reference map on said display configured for guiding an operator to move said one of said receiving probe and said transmitting object between said test points;

wherein said fourth plurality of non-transitory machine instructions comprises instructions configured to load onto said processor and execute software for implementing said test plan by controlling at least some of said equipment items coupled to said computer processor configured for measuring test data, a position of at least some of said objects and an orientation of at least some of said objects at each test point, and for time-stamping and storing each measured data set into a measurement data structure comprising said test data, said position of at least some of said objects, said orientation of at least some of said objects at each test point, and said time stamp associated with each said measurement data entry in said measurement data structure;

wherein said fifth plurality of non-transitory machine instructions comprises instructions configured to load onto said processor and execute software for controlling at least some of said equipment items and determining from said stored measurement data that is configured for setting and storing an actual coordinate location of said test points into an actual coordinate location of test points data structure;

wherein said sixth plurality of non-transitory machine instructions comprises instructions configured to load onto said processor and execute software for displaying a graphical user interface on said display comprising a graphical representation of said predefined objects and progress of said test plan implementation based on at least some of said data structures.

20. The recording medium operable for storing non-transitory machine readable instructions software for spatial pattern analysis according to claim 19, wherein said fifth plurality of non-transitory machine instructions for determining from said stored data sets an actual coordinate location of said test points further comprises a non-transitory machine readable instructions operable to operate said processor to create and store into a rotational matrix data structure a rotational matrix data for translating said measured position and orientation into an exact coordinate location in said computer memory.

21. The recording medium operable for storing non-transitory machine readable instructions software for spatial pattern analysis according to claim 19, wherein said second plurality of non-transitory machine instructions for implementing said test plan by measuring test data controls at least some said equipment items and measures a GPS position of each said object and stores said object's GPS position in an object GPS location data structure in said computer memory.

22. The recording medium operable for storing non-transitory machine readable instructions software for spatial pattern analysis according to claim 21, wherein said second plurality of non-transitory machine instructions for implementing said test plan controls at least some said equipment items and measures an RTK/GPS position of each said object and stores said objects' RTK/GPS position in an object RTK/GPS position data structure in said computer memory.

23. The recording medium operable for storing non-transitory machine readable instructions software for spatial pattern analysis according to claim 19, wherein said second plurality of non-transitory machine instructions for implementing said test plan controls at least some said equipment items and measures an azimuth, pitch, and roll of said object and stores said azimuth, pitch, and roll of said object in an orientation data structure in said computer memory.

24. The recording medium operable for storing non-transitory machine readable instructions software for spatial pattern analysis according to claim 19, wherein said second plurality of non-transitory machine instructions for implementing said test plan controls at least some said equipment items and measures RF amplitude data.

25. The recording medium operable for storing non-transitory machine readable instructions software for spatial pattern analysis according to claim 19, wherein said second plurality of non-transitory machine instructions for implementing said test plan controls at least some said equipment items and measures RF phase data.

26. A system for implementing an RF test plan for spatial pattern analysis of an RF antenna system, comprising a plurality of non-transitory processing sequences, comprising:

a computer medium comprising a plurality of non-transitory machine readable processing sequence instructions operable to control a plurality of equipment items, a data storage section comprising a random access memory (RAM) and another data storage section, and a computer processor, said equipment items comprising a multi-axis sensor configured to determine three-axis orientations, a global positioning system (GPS), a real time kinematics (RTK)/GPS system, a display, and a radio frequency (RF) transmitter/receive station configured to receive, transmit and measure RF signals, wherein said plurality of machine readable processing sequence instructions comprise;

a first non-transitory processing sequence adapted to control said processor to operate at least some said equipment items and determine location and orientation of a point on a mobile structure based on measurements from a plurality of measurement devices coupled to said mobile structure;

a second non-transitory processing sequence for controlling said processor to operate at least some said equipment items and creating a database of structural data defining transmit and receive antenna structures, supporting structures, and surrounding terrain;

a third non-transitory processing sequence for controlling said processor to operate at least some said equipment items and measuring RF amplitude at specified frequencies and specified locations;

a fourth non-transitory processing sequence for controlling said processor to operate at least some said equipment items and adjusting the specified measurement locations in accordance with said second processing sequence; and a fifth non-transitory processing sequence for controlling said processor to operate at least some said equipment items and generating a graphical user interface (GUI) on said display adapted to permit a user to create, load and store said RF test plan for spatial pattern analysis of an RF antenna system.

* * * * *